(12) United States Patent
Moddel

(10) Patent No.: US 11,258,379 B2
(45) Date of Patent: *Feb. 22, 2022

(54) QUANTUM NOISE POWER DEVICES

(71) Applicant: The Regents of the University of Colorado, a body corporate, Denver, CO (US)

(72) Inventor: Garret Moddel, Boulder, CO (US)

(73) Assignee: THE REGENTS OF THE UNIVERSITY OF COLORADO, A BODY CORPORATE, Denver, CO (US)

(*) Notice: Subject to any disclaimer, the term of this patent is extended or adjusted under 35 U.S.C. 154(b) by 2 days.

This patent is subject to a terminal disclaimer.

(21) Appl. No.: 16/855,897

(22) Filed: Apr. 22, 2020

(65) Prior Publication Data
US 2020/0358375 A1 Nov. 12, 2020

Related U.S. Application Data

(66) Substitute for application No. 62/904,666, filed on Sep. 23, 2019, and a continuation-in-part of application No. 62/920,636, filed on May 10, 2019.

(51) Int. Cl.
*H02N 11/00* (2006.01)
*H01L 49/00* (2006.01)

(52) U.S. Cl.
CPC .......... *H02N 11/002* (2013.01); *H01L 49/006* (2013.01)

(58) Field of Classification Search
CPC .... H02N 11/002; H02N 11/008; H01L 49/006
USPC ..... 290/1 R; 244/171.1–171.9; 361/230–239
See application file for complete search history.

(56) References Cited

U.S. PATENT DOCUMENTS

| | | |
|---|---|---|
| 5,590,031 A | 12/1996 | Mead et al. |
| 6,477,028 B1 | 11/2002 | Pinto |
| 6,593,566 B1 | 7/2003 | Pinto |
| 6,650,527 B1 | 11/2003 | Pinto |
| 6,665,167 B2 | 12/2003 | Pinto |
| 6,842,326 B2 | 1/2005 | Pinto |
| 6,920,032 B2 | 7/2005 | Pinto |
| 7,379,286 B2 | 5/2008 | Haisch et al. |
| 7,411,772 B1 | 8/2008 | Tymes |
| 8,039,368 B2 | 10/2011 | Drndic |
| 8,317,137 B2 | 11/2012 | Cormier |
| 8,803,340 B2 | 8/2014 | Moddel |
| 8,913,366 B1 | 12/2014 | Mezinis |
| 9,581,142 B2 | 2/2017 | Moddel |
| 9,634,158 B2 | 4/2017 | Kobayshi |

(Continued)

FOREIGN PATENT DOCUMENTS

WO 2000071894 A1 11/2000

OTHER PUBLICATIONS

Atar, et. al., 2013, "Plasmonically Enhanced Hot Electron Based Photovoltaic Device," Optics Express 21:6, 7196-7201.

(Continued)

*Primary Examiner* — Pedro J Cuevas
(74) *Attorney, Agent, or Firm* — Kilpatrick Townsend & Stockton LLP

(57) ABSTRACT

Described herein are devices in which quantum noise is reduced, such as by incorporating the devices as part of or adjacent to a Casimir cavity. The devices with reduced quantum noise can be paired with a free-space electric device to allow for a difference in noise power between the two to be captured.

53 Claims, 14 Drawing Sheets

(56) References Cited

U.S. PATENT DOCUMENTS

| | | | |
|---|---|---|---|
| 10,199,414 | B2 | 2/2019 | Kobayshi |
| 10,612,971 | B2 | 4/2020 | Huang |
| 2006/0027709 | A1 | 2/2006 | Pinto |
| 2007/0007393 | A1 | 1/2007 | Pinto |
| 2007/0241470 | A1 | 10/2007 | Haisch et al. |
| 2008/0296437 | A1 | 12/2008 | Cormier |
| 2009/0322221 | A1 | 12/2009 | Makansi |
| 2010/0142259 | A1 | 6/2010 | Drndic |
| 2010/0237198 | A1 | 9/2010 | Cormier |
| 2013/0283797 | A1 | 10/2013 | Bressi |
| 2014/0092520 | A1 | 4/2014 | Rosendorf |
| 2014/0092521 | A1 | 4/2014 | Rosendorf |
| 2014/0158887 | A1 | 6/2014 | Rosendorf |
| 2014/0158906 | A1 | 6/2014 | Rosendorf |
| 2014/0353577 | A1 | 12/2014 | Agarwal |
| 2014/0374865 | A1 | 12/2014 | Kobayashi |
| 2017/0199078 | A1 | 7/2017 | Huang |
| 2017/0338355 | A1 | 11/2017 | Kobayashi et al. |
| 2018/0059704 | A1 | 3/2018 | Villalobos |
| 2019/0207537 | A1 | 7/2019 | Bressi |
| 2020/0011978 | A1 | 1/2020 | Chu |
| 2020/0357997 | A1 | 11/2020 | Moddell |
| 2020/0358375 | A1 | 11/2020 | Moddel |
| 2020/0395872 | A1 | 12/2020 | Moddell |

OTHER PUBLICATIONS

Blandford and Thome, 2008, "Applications of Classical Physics," Lecture Notes Chapter 6, California Institute of Technology, Version 12.

Brongersma, et al., (Eds.), 2007, "Surface Plasmon Nanophotonics", (vol. 131); Springer.

Brongersma, 2015, "Plasmon-Induced Hot Carrier Science and Technology", Nature Nanotechnology, 10:1,25-34.

Chalabi, et al., 2014, "Hot-Electron Photodetection with a Plasmonic Nanostripe Antenna," Nano Lett., 14:3, 1374-1380.

Clavero, 2014, "Plasmon Induced Hot-Electron Generation at Nanoparticle/Metal-Oxide Interfaces for Photovoltaic and Photocatalytic Devices," Nature Photonics, 8:2, 95-103.

Cowell, William E., et. al., "Barrier Height Estimation of Asymmetric Metal-Insulator-Metal-Tunneling Diodes", J. Appl. Phys., 114:213703, (2013).

Du,et. al., 2013, "Ultrafast Plasmon Induced Electron Injection Mechanism in Gold-Ti02 Nanoparticle System." J. Photochem. and Photobiol. C: Photochem. Revs., 15,21-30.

Gall, 2016, "Electron Mean Free Path in Elemental Metals," J. Appl. Phys., 119:8, 085101.

Genet, et. al., 2003, "Casimir Force and the Quantum Theory of Lossy Optical Cavities," Phys. Rev. A, 67:4, 043811.

Gong, et. al., 2007, "Design of Plasmonic Cavities for Solid-State Cavity Quantum Electrodynamics Applications," Appl. Phys. Lett., 90:3, 033113. (abstract only).

Grover, S., et. al., "Metal Single-Insulator and Multi-Insulator Diodes for Rectenna Solar Cells", 21 pgs.

Helman, et. al., 1973, "Theory of Internal Photoemission," Phys. Rev. B, 7:8, 3702.

Herner, et. al., 2017, "High Performance MIIM Diode Based on Cobalt Oxide/Titanium Oxide," Appl. Phys. Lett., 110, 223901.

Jiang, et. al., 2017, "Photoelectrochemical Devices for Solar Water Splitting-Materials and Challenges,", Chem. Soc. Rev., 46:15, 4645-4660.

John, et. al., 2017, "Optical Properties of Graphene, Silicene, Germanene, and Stanine from IR to Far UV—a First Principles Study," J. Phys, and Chem. of Solids, 110, 307-315. (abstract only).

Kish, 2005, "Stealth Communication: Zero-Power Classical Communication, Zeroquantum Quantum Communication and Environmental-Noise Communication," Appl. Phys. Lett.,87:23, 234109.

Kish, et al., 2016, "Zero-Point Term and Quantum Effects in the Johnson Noise of Resistors: a Critical Appraisal," J. Stat. Mech.: Theory and Experiment, 2016:5, 054006.

Knight, et. al., 2013, "Embedding Plasmonic Nanostructure Diodes Enhances Hot Electron Emission," Nano Lett., 13:4, 1687-1692. (abstract only).

Kodama, et. al., 2001, "Fast Heating of Ultrahigh-Density Plasma as a Step Towards Laser Fusion Ignition," Nature, 412:6849, 798.

Lambe, et. al., 1976, "Light Emission From Inelastic Electron Tunneling," Phys. Rev.Lett., 37:14, 923.

Lebedev et al., 1999, "The dynamics of wire array Z-pinch implosions," Phys. of Plasmas, 6:5, 2016-2022. (abstract only).

Li, Rengui, 2017, "Latest Progress in Hydrogen Production from Solar Water Splitting Via Photocatalysis, Photoelectrochemical, and Photovoltaic-Photoelectrochemical Solutions,", Chinese Journal of Catalysis, 38:1,5-12. (abstract only).

McCarthy, et. al., 1977, "Enhancement of Light Emission from Metal-Insulator-Metal Tunnel Junctions," Appl. Phys. Lett., 30:8, 427-429.

Mizuguchi, et. al., 2007, "Simulation of High-Energy Proton Production by Fast Magnetosonic Shock Waves in Pinched Plasma Discharges," Phys. of Plasmas, 14:3, 032704.

Moddel, G. and Dmitriyeva, 0., 2019, "Extraction of Zero-Point Energy from the Vacuum: Assessment of Stochastic Electrodynamics-Based Approach as Compared to Other Methods," Atoms, 7(2), 51.

Moddel, G "Will Rectenna Solar Cells Be Practical?", 22 pgs. (2013).

Ozawa, et al., 2007, "Preparation and Characterization of the Eu3+ Doped Perovskite Nanosheet Phosphor: Lao.90Euo.osNb207," Chemistry of Materials, 19:26, 6575-6580.

Sze, et. al., 2006, "Physics of Semiconductor Devices," John Wiley & Sons, p. 682.

Van Dorp, et. al., 2009, "SiC: a Photocathode for Water Splitting and Hydrogen Storage," Angewandte Chemie Intl. Ed., 48:33, 6085-6088.

Viswanath, e.t aL, 2019, "A Nanosheet Phosphor of Double-Layered Perovskite with Unusual Intrananosheet Site Activator Concentration," Chem. Eng. J., 122044.

Wang, et. al., 2000, "Light Emission From the Double-Barrier AI/Ah03/AI/Ah03/Au Tunnel Junction," Thin Solid Films, 371:1-2, 191-194.

Wang, et. al., 2011, "Plasmonic Energy Collection Through Hot Carrier Extraction," Nano Lett., 11: 12, 5426-5430. (abstract only).

Wang, et. al., 2017, "Field-Assisted Splitting of Pure Water Based on Deep-Sub-Debyelength Nanogap Electrochemical Cells," ACS Nano, 11:8, 8421-8428.

Walter, et. al., 2010, "Solar Water Splitting Cells," Chem. Rev. 110: 11, 6446-6473.

Yam, P., "Exploiting Zero-Point Energy", Scientific American, Scientific American, Inc., New York, NY, US, vol. 277, No. 6, Dec. 1, 1997 (Dec. 1, 1997) pp. 54-57.

Zhu, 2014, "Graphene Geometric Diodes for Optical Rectennas," PhD Thesis, University of Colorado, 68-77.

Zhu, et. al., 2019, "Graphene Geometric Diodes for Terahertz Rectennas", J. Phys. D: Appl. Phys., 46, 185101.

International Search Report and Written Opinion dated Jul. 31, 2020 in related application No. PCT/IB2020/054254, all pgs.

International Search Report and Written Opinion dated Aug. 3, 2020 in related application No. PCT/IB2020/054255, all pgs.

International Search Report and Written Opinion dated Sep. 22, 2020 in application No. PCT/US2020/032251, all pgs.

Visser, et. al.: II Follow Up: "What is the 'Zero-Point Energy' (or 'vacuum energy 1 ) in Quantum Physics? Is it Really Possible That We Could Harness This Energy?" 11, Scientific American, Aug. 18, 1997 (Aug. 18, 1997), XP055728009.

Dmitriyeva, et. al.,:"Test of Zero-point Energy Emission from Gases Flowing Through Casimir Cavities", Physics Procedia, x A vol. 38, Nov. 8, 2012 (Nov. 8, 2012), pp. 8-17, XP028514995, ISSN: 1875-3892, DOI: 10.1016/J.PHPR0.2012.08.007.

International Search Report and Written Opinion dated Nov. 5, 2020 in application No. PCT/IB2020/054256, all pgs.

Francesco Intravaia, et. al.: "Strong Casimir Force Reduction Through Metallic Surface Nanostructuring", Nature Communications, vol. 4, No. 1, Sep. 27, 2013 (Sep. 27, 2013).

ific example, the resistor comprises a conductive layer adjacent to the Casimir cavity or comprising a component of the Casimir cavity. For example, the resistor can be a metal layer that provides a resistive structure at the same time as functioning, at least in part, as a reflector of the Casimir cavity. Materials other than metal may be used for such a resistor. In one example, graphene can be used.

QUANTUM NOISE POWER DEVICES

CROSS REFERENCE TO RELATED APPLICATIONS

This application claims the benefit of and priority to U.S. Provisional Application No. 62/904,666, filed on Sep. 23, 2019, and U.S. Provisional Application No. 62/920,636, filed on May 10, 2019, which are hereby incorporated by reference in their entireties.

FIELD

This invention is in the field of electronic devices. This invention relates generally to quantum devices for harvesting and generating electrical energy.

BACKGROUND

According to quantum theory the quantum vacuum is filled with electromagnetic radiation in the form of quantum vacuum fluctuations, and devices exhibiting associated quantum noise. There has been substantial discussion about whether this energy can be harvested, and if so, how. A chief problem in harvesting this energy is that it forms the energy ground state, and so it does not flow from one region to another. However, the quantum vacuum energy is geometry-dependent, and its density is lower in a Casimir cavity than outside of the Casimir cavity. The use of Casimir cavities therefore opens the possibility of making use of the quantum vacuum fluctuations to drive energy from one location to another.

SUMMARY

Devices for generation of electrical energy are described herein. In embodiments, devices described herein use two different regions in which the zero-point fluctuations are different to allow a portion of noise power arising from the zero-point fluctuations to be harvested.

In an aspect, devices disclosed herein make use of zero-point-energy-density reducing structures, such as to create a region where the zero-point energy density is lower than in its surroundings, which can allow for driving a flow of energy, such as between an electric device adjacent to or adjoining the zero-point energy-density reducing structure and another device. An example device of this aspect comprises an electric device and a zero-point-energy-density-reducing structure adjoining the electric device. The zero-point-energy-density-reducing structure can provide a reduction in a zero-point energy density in the electric device as compared to the zero-point energy density in a second electric device, such as a second electrical device that does not adjoin the zero-point-energy-density-reducing structure but that is in electrical communication with the electric device. In some examples, the zero-point-energy-density-reducing structure comprises a Casimir cavity.

The devices disclosed herein are distinguished from solar cells, photodiodes, or other devices that convert light from an external illumination source into an electrical current and are capable of producing a flow of energy that occurs even in the absence of external sources of illumination. Stated another way, the disclosed devices are capable of producing power whether in dark conditions or in light conditions.

Devices of this aspect include those where the electric device comprises a resistor, such as a resistor adjoining a Casimir cavity. Such a device may be described herein as a Casimir resistor. In a specific example, the resistor comprises a conductive layer adjacent to the Casimir cavity or comprising a component of the Casimir cavity. For example, the resistor can be a metal layer that provides a resistive structure at the same time as functioning, at least in part, as a reflector of the Casimir cavity. Materials other than metal may be used for such a resistor. In one example, graphene can be used.

Devices of this aspect include those where the electric device comprises a rectifier, one-way valve, or diode, such as a diode adjoining a Casimir cavity. Such a device may be described herein as a Casimir diode. In a specific example, the diode comprises a geometric diode. Diodes useful with devices of this aspect include, but are not limited to, geometric diodes and other structures, such as conductor/insulator/conductor structures or conductor/semiconductor structures.

Devices of this aspect are useful in circuits, which can allow for harvesting and/or transport of energy. In one example, a circuit may comprise an electric device, such as a Casimir resistor or a Casimir diode, and a free-space electric device electrically connected between a first electrical contact of the electric device and a second electrical contact of the electric device. Free-space electric devices may correspond, for example, to electric devices, such as resistors, diodes, or other devices, which do not have an adjoining zero-point-energy-density reducing structure. Such a configuration can provide for a first zero-point energy density at the electric device being different from a second zero-point energy density at the free-space electric device, and can provide that a first zero-point energy noise power available from the electric device is different from a second zero-point energy noise power available from the free-space electric device. In some cases, the free-space electric device is a free-space diode or a free-space resistor.

Optionally, a pair (or pairs) of antennas may be used to transfer energy or power between parts of the circuit, such as where a first antenna of a pair is electrically connected between electrical contacts of the device or a component thereof, with a second antenna of the pair optically coupled to the first antenna and electrically connected to another device, such as a free-space electric device.

Efficient coupling of the electric device and the free-space electric device may be useful for limiting power loss between the devices. For example, electrical transmission lines between the free-space electric device and the electric device may be high-frequency transmission lines, such as those capable of carrying signals having a frequency from 1 THz to 3 PHz. Such a configuration may use very short electrical transmission lines (e.g., less than 10 μm or less in length) and/or materials that are highly conductive. In a specific example, the electrical transmission lines may comprise a superconductor.

Devices and circuits of this aspect may be useful for a variety of applications, including thermal applications, such as for providing cooling or heating by transferring energy between a free-space electric device and a device adjoining a zero-point-energy-density-reducing structure. In some examples, a component of the circuits described herein may be thermally coupled to a heat transfer component, such as a thermal sink or a thermal source, to provide for absorption of thermal energy from the environment or transfer of thermal energy to the environment, depending on the placement of the heat transfer component.

In some cases, the devices and circuits described herein may be useful for capturing noise power to provide for use by an external load. In some example circuits, the electric device corresponds to a resistor or a diode (i.e., where the electric device and the adjoining zero-point-energy-density-reducing structure together form a Casimir resistor or a Casimir diode), and the free-space electric device also corresponds to a resistor or a diode, but where the electric device is a resistor or a diode and free-space device is the opposite type of component, or the electric device is a diode and the free-space device is a diode. For example, the electric device may comprise a resistor while the free-space device may comprise a free-space diode. Alternatively, the electric device may comprise a Casimir diode while the free-space device may comprise a free-space resistor. Such configurations may be useful for allowing net zero-point energy noise power to be obtained as a DC power output, as a diode in such a circuit can be used for rectification of a noise current.

As noted above, a zero-point-energy-density-reducing structure may comprise a Casimir cavity. In some examples, a Casimir cavity comprises a first reflective layer, a cavity layer, and a second reflective layer, with the cavity layer positioned between the first reflective layer and the second reflective layer. The reflective layers may comprise metal or other reflective materials or structures. The cavity layer may comprise an optically transparent material. In some examples, the cavity layer has a thickness of from 10 nm to 2 μm. At least one of the two reflectors of the Casimir cavity may have a reflectivity of greater than 50%, such as for at least some wavelengths of electromagnetic radiation from 100 nm to 10 μm. In some examples, a reflective layer of a Casimir cavity may serve as a hybrid layer, functioning both as a reflector and as a component of an electric device. For example, a reflective layer of a Casimir cavity may also comprise a resistive layer or a layer of a diode.

In another aspect, device arrays are disclosed, such as for producing electrical power. An example device array of this aspect comprises a plurality of devices or circuits described herein, arranged in an array configuration. In one example, an array may comprise a plurality of circuits including a free-space device and an electrical device adjoining a Casimir cavity, such as described above. In some examples, at least a subset of the plurality of devices or circuits are optionally arranged in a series configuration. Optionally, at least a subset of the plurality of devices or circuits are arranged in a parallel configuration. In some examples, the plurality of devices or circuits are arranged in a combination of series and parallel configurations.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

DETAILED DESCRIPTION

Quantum vacuum fluctuations fill all space with electromagnetic radiation. The energy density of this radiation in free space is $$\rho(hf) = \frac{8\pi f^2}{c^3}\left(\frac{hf}{\exp(hf/kT)-1} + \frac{hf}{2}\right) \qquad \text{Eq. 1}$$

where h is Planck's constant, f is the frequency of the radiation, c is the speed of light, k is Boltzmann's constant, and T is the temperature. The first term in brackets in Eq. 1 is due to thermal blackbody radiation at non-zero temperatures, and the second term is temperature independent and corresponds to the quantum vacuum radiation.

Figure 1:
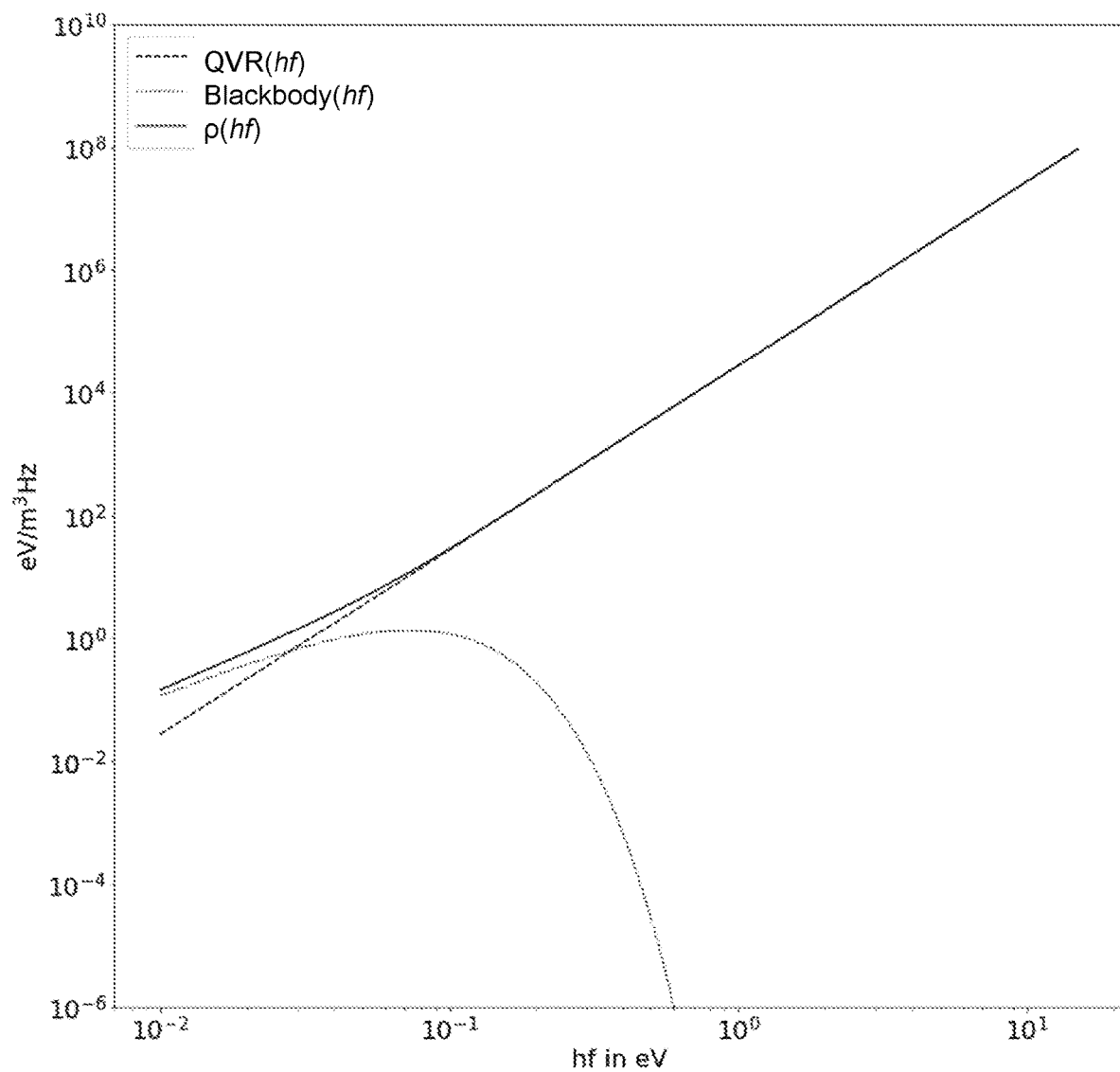
FIG. 1 provides a plot showing energy density spectra for quantum vacuum radiation and blackbody radiation.

The energy density (p(hf)) spectrum for both the temperature dependent term and the temperature independent term in Eq. 1 is shown in FIG. 1, where the data is plotted as a function of photon energy, hf, where h is Planck's constant and f is optical frequency, which varies with the reciprocal of the wavelength. At 300 K, the thermal component (labeled Blackbody(hf) in FIG. 1) reaches its maximum in the infrared through visible parts of the spectrum, whereas the quantum vacuum radiation (labeled QVR(hf) in FIG. 1) component grows with the frequency cubed and becomes much larger than the thermal component of the spectrum at visible light frequencies and beyond (as shown in Eq. 1, above, and Eq. 2, below). For 300 K blackbody radiation, the quantum vacuum radiation component exceeds the thermal part for any frequencies above 7 THz, corresponding to a photon energy of approximately 29 meV. Because the energy density of the quantum vacuum radiation part of the spectrum at high frequencies is much larger than that of the thermal spectrum, much more power may be available from the quantum vacuum radiation.

Harvesting energy arising out of the quantum vacuum radiation does not appear to violate any physical laws, but because the energy corresponds to that of the ground-state, there is generally no driver for the energy to flow. However, the quantum vacuum radiation is geometry dependent, and its density can be different in different regions of space. For example, a zero-point-energy-density-reducing structure can establish a geometric condition where the quantum vacuum radiation density in one region of space can be lower than in free space, such as outside the structure, which, therefore, provides a condition for energy flow to occur. One approach is described in U.S. Pat. No. 7,379,286, which is hereby incorporated by reference.

Another approach is to make use of electrical fluctuations, also known as noise, in resistors and other electronic devices for energy harvesting. There are two sources for the fundamental noise in resistors and other electronic devices: thermal and zero-point energy fluctuations. Thermal fluctuations are described by the Johnson-Nyquist formula $$S(f) = 4R(f)hfN(f,T), \quad \text{Eq. 2}$$

where S(f) is the power spectrum of the voltage noise density (equal to the mean-square voltage per unit frequency) available at a matched load from a resistor R(f). N(f,T) is the mean number of energy quanta, each having an energy hf. It is $$N(f, T) = \frac{1}{\exp(hf/kT) - 1}. \quad \text{Eq. 3}$$

As the temperature goes to zero or the frequency becomes very large, the N decreases.

This thermal resistor noise power can be harvested by another device. For example, a diode connected to the noisy resistor can rectify the noise and produce DC power. This can be accomplished if the devices are at different temperatures. If the source (the resistor) and the sink (the diode) are at the same temperature, it would be a violation of the second law of thermodynamics to be able to harvest thermal energy from the system.

The Johnson-Nyquist formula given above does not account for zero-point energy, and when zero-point energy is considered there is an additional term of ½ of an energy quantum in the S(f) expression, such that $$S(f) = 4R(f)hf[N(f, T) + 1/2] = 4R(f)hf\left(\frac{1}{\exp(hf/kT) - 1} + \frac{1}{2}\right). \quad \text{Eq. 4}$$

Above 7 THz, the ½ term for the zero-point energy dominates over the thermal term at room temperature. At very high frequencies or very low temperatures, the thermal part of the power spectrum can be neglected and the power spectrum may be approximated as $$S(f) = 4R(f)hf\left(\frac{1}{2}\right) = 2R(f)hf. \quad \text{Eq. 5}$$

This is the resistor noise due only to zero-point energy fluctuations.

The zero-point resistor noise power cannot be harvested by another device in the same way as the thermal resistor noise can because it is independent of temperature. Under normal circumstances the source and sink will each have the same level of zero-point energy, and there will be no differential to drive a net flow of power that could be harvested. By using a zero-point-energy-density-reducing structure to establish different zero-point energy densities in different spatial regions, zero-point energy fluctuations in resistors and other electronic devices can be harvested.

One example of a zero-point-energy-density-reducing structure is a Casimir cavity, which can be formed using two closely-spaced, parallel reflecting plates. As a result of the requirement that the tangential electric field must vanish (for an ideal reflector) at the boundaries, limits are placed on which quantum vacuum modes (i.e., field patterns) are allowed between the plates. In general, the modes allowed include those where the gap spacing is equal to an integer multiple of half of the wavelength. Modes having wavelengths longer than twice the gap spacing are largely excluded. This results in the full spectrum of quantum vacuum modes exterior to the plates, described by Eq. 1, being larger and more numerous than the constrained set of modes in the interior, and thus there is a lower energy density in the interior. The critical dimension, which determines the wavelength above which quantum vacuum modes are suppressed, is the gap spacing (for the case of a one dimensional Casimir cavity). Casimir cavities can also be constructed in the form of cylinders (nanopores), in which case the critical dimension is the diameter. Casimir cavities may be formed having other geometries as well, which can be used with the disclosed devices. Aspects described herein make use of the fact that the quantum vacuum energy level is dependent upon the local geometry, specifically the presence of a zero-point-energy-density-reducing structure, like a Casimir cavity.

Figure 2:
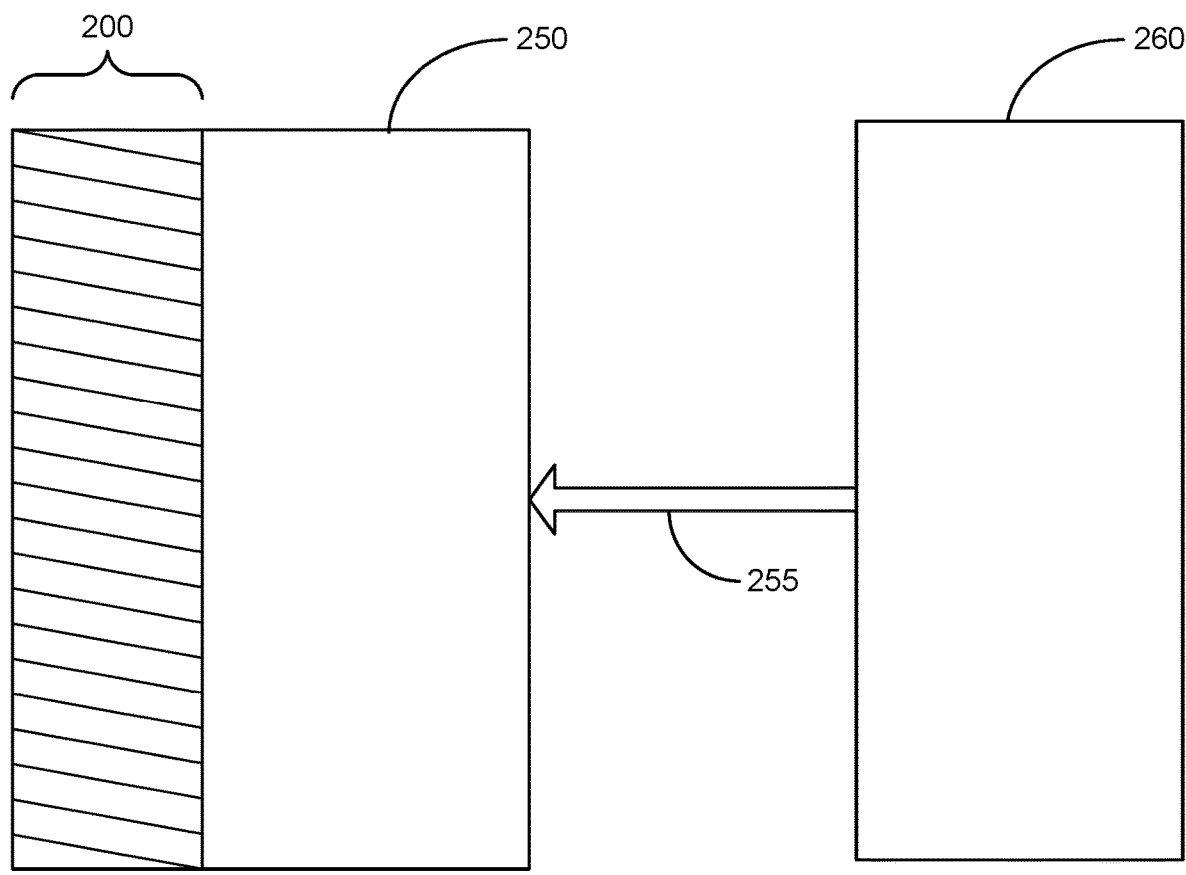
FIG. 2 provides a schematic illustration of an example zero-point-energy-density-reducing structure coupled to a first device in a configuration for transferring energy from a second device to the first device, in accordance with at least some embodiments.

Zero-point energy is the ground state energy of a system that remains even at zero temperature. Quantum vacuum fluctuations are zero-point energy fluctuations in the form of electromagnetic radiation. Internal zero-point energy fluctuations also exist in materials that do not support electromagnetic radiation. To be able to make use of a difference in zero-point energy densities, an asymmetry with respect to a zero-point-energy-density-reducing structure may be used, allowing a portion of the energy to be harvested. As shown in FIG. 2, a zero-point-energy-density-reducing structure 200 can be used to establish an asymmetry in zero-point energy densities between a first device 250 and a second device 260, such as by having the first device 250 be positioned adjacent to or adjoining the zero-point-energy-density-reducing structure 200, for example. By using a structure for producing a reduction in the zero-point energy density adjacent to the first device 250 but not adjacent to the second device 260, and means for energy transport as schematically shown by arrow 255, a net power flows from the second device 260, which has no zero-point-energy-density-reducing structure adjacent to it, and hence has a higher zero-point energy level, to the first device 250, which is adjacent to the zero-point-energy-density-reducing structure 200, and hence has a lower zero point energy density. The same concept applies if both devices are adjacent to zero-point-energy-density-reducing structures, but having different critical dimensions or frequency cutoffs.

Another way to characterize an asymmetry requirement is in terms of equilibrium and detailed balance. In equilibrium, the flow of energy from any first element to any second element must be balanced by an equal energy flow from the second element to the first element. This results from a detailed balance. A zero-point-energy-density-reducing structure can facilitate a means to break this balance, so that there is a smaller flow of energy from the device adjacent to or adjoining the zero-point-energy-density-reducing structure than from the device without it.

Casimir Cavities.

Figure 3:
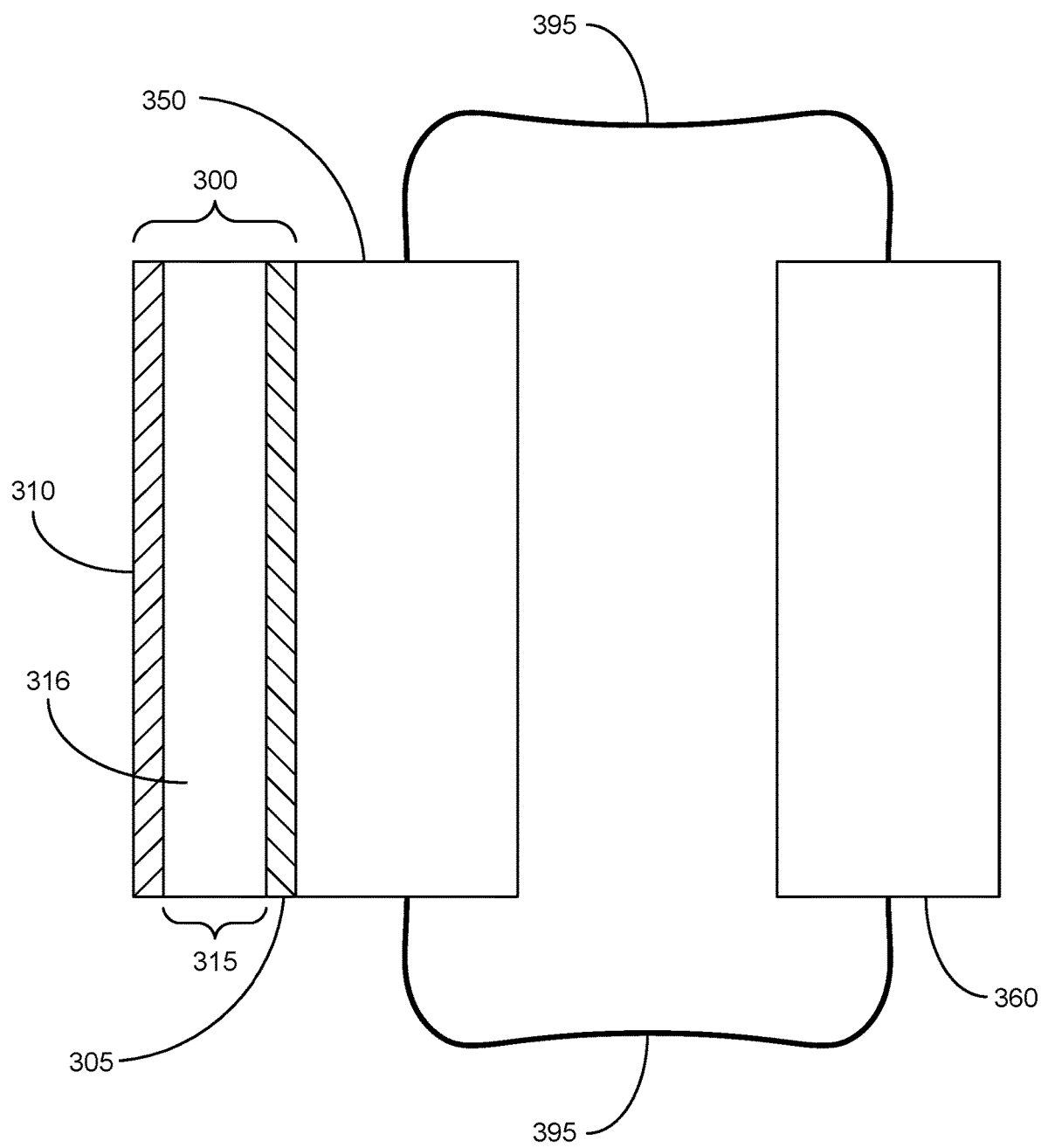
FIG. 3 provides a cross-sectional illustration of an example Casimir cavity adjacent to an example electric device, in accordance with at least some embodiments.

FIG. 3 provides a schematic illustration of an example Casimir cavity 300 adjacent to a first electric device 350 but not adjacent to a second electric device 360. Casimir cavity 300 comprises a first reflector 305, a second reflector 310, and a gap 315 between the first reflector 305 and the second reflector 310. Gap 315 (also referred to herein as a cavity layer) may be an empty gap (e.g., evacuated or corresponding to a vacuum) or filled with a gas, which may be achieved with rigid substrates and spacers. In some embodiments, gap 315 may be filled with a material 316, such an at least partially transparent optical material for at least some wavelengths of electromagnetic radiation supported by the Casimir cavity, preferably the entire visible range through the near ultraviolet. In contrast with a gas, material 316 may comprise a condensed-phase material, such as a solid, liquid, or liquid crystal. Example materials useful as a cavity layer include, but are not limited to, silicon oxide or aluminum oxide. Alternatively, it may be sufficient or desirable to fill the gap with a polymer such as PMMA (polymethyl methacrylate), polyimide, polymethyl methacrylate, or silicone, which can provide adequate transparency at wavelengths of interest. In some examples, the material of a cavity layer, such as those materials described above, may have a transmittance of greater than 20% for at least some wavelengths of electromagnetic radiation from 100 nm to 10 µm. Advantageously, the material of a cavity layer may have a transmittance of greater than 50% for at least some wavelengths of electromagnetic radiation from 100 nm to 10 µm. In some cases, the material of the cavity layer, including at least some of the materials described above, may have a transmittance of greater than 70% or greater than 90% for at least some wavelengths of electromagnetic radiation from 100 nm to 10 µm. The thickness or spacing of gap 315 can be set by the target wavelength range for the Casimir cavity. In some examples, the gap 315 of a Casimir cavity can have a spacing of from 10 nm to 2 µm.

The reflector material for first reflector 305 and/or second reflector 310 can be chosen based upon its reflectivity over the wavelength range of interest, ease of deposition, and/or other considerations, such as cost. The reflector thickness must be sufficient to provide adequate reflectivity, but not so thick as to be difficult to pattern. In some examples, a reflector can have a thickness of at least 10 nm, such as from 10 nm to 1 cm. Example materials useful as a reflector of a Casimir cavity include, but are not limited to, metals, dielectric reflectors, or diffractive reflectors, such as Bragg reflectors or metamaterial reflectors. Example metals useful for a reflector of a Casimir cavity include, but are not limited to, Al, Ag, Au, Cu, Pd, or Pt. Example dielectrics useful for a dielectric reflector include, but are not limited to $ZrO_2$, $SiO_2$, $Si_3N_4$, $Nb_2O_5$, $TiO_2$, $MgF_2$, $LiF$, $Na_3AlF_6$, $Ta_2O_5$, $LaTiO_3$, $HfO_2$, $ZnS$, $ZnSe$, or the like. Example reflectivity of at least one the two reflectors of a Casimir cavity is from 50% to 100% for at least some wavelengths of electromagnetic radiation from 100 nm to 10 µm. The reflectors of a Casimir cavity do not have to be metals or dielectric reflectors, and instead a reflective interface may be used. For example, the reflective layer can be a step in the index of refraction at an interface between two adjacent materials, such as between the cavity layer and its surrounding material. In some cases the cavity walls can provide a step in dielectric constant or index of refraction on transitioning from one dielectric material to another one or more, or between a dielectric material and free space.

Alternatively, a Casimir cavity may be formed from a distributed Bragg reflector type multilayer dielectric stack. For example such a stack can comprise alternating layers of two or more dielectric materials having different indices of refraction. For the case of two types of materials, the thickness of each pair of layers characterizes the pitch. Wavelengths of twice the pitch are reflected, and longer wavelengths are largely suppressed. It is to be noted that this differs from antireflection coatings, in which the pitch is one quarter of a wavelength rather than one half of a wavelength, which is the case here. The layer thicknesses may further be chirped to enhance the spectral width of the reflections. Any suitable number of alternating dielectric layers of can be used, such as from 2 layers to 100 layers, or more. For example, to suppress a wavelength of 250 nm with a stack with alternating layers of $SiO_2$ and $Al_2O_3$, the layer thickness would be 42 nm and 35 nm, respectively. For a total of ten pairs of layers the overall thickness would be 770 nm.

In FIG. 3, first electric device 350 is positioned adjacent to the Casimir cavity 300 such that its zero-point energy density or internal zero-point fluctuations are reduced, such as compared to the second electric device 360, which is a free-space electric device (i.e., not subjected to any Casimir cavity) or positioned adjacent to a different Casimir cavity. Electrical leads 395 can be connected between the first electric device 350 and the second electrical device 360, and to provide electrical connections to an external circuit, such as including a load or other free-space electric devices.

Casimir Resistors.

In principle, to limit the zero-point fluctuations in a resistor, it may be placed in a Casimir cavity. A more practical way to form such a device is to incorporate a Casimir cavity onto the resistor (the "Casimir resistor"). A resistor can be formed from a thin metal film or other conducting film, for example. Zero-point energy fluctuations in the metal film arise from internal zero-point energy modes and also from the incident zero-point field (quantum vacuum radiation) described by the right-hand term in the bracket in Eq. 1. This incident zero-point field gives rise to photoexcited hot electrons in the metal film, which contribute to resistor noise due to zero-point energy fluctuations. When a Casimir cavity is adjacent to the metal film, it suppresses a fraction of the zero-point field, which then suppresses some of the fluctuations, i.e., noise, in the resistor.

The effect of the zero-point field in providing electrons does not have to be via hot electron emission. The charges can be energized from hot plasmonic carriers, and from other waves in the materials. It will be appreciated that, although aspects described herein may be explained by reference to electrons as charge carriers, other charge carriers may be substituted for electrons for various implementations and operations of the disclosed devices, systems, techniques, and methods. Example charge carriers include, but are not limited to electrons, holes, Cooper pairs, any charged species, or magnetic fluxes, such as used in the field of spintronics.

Figure 4A:
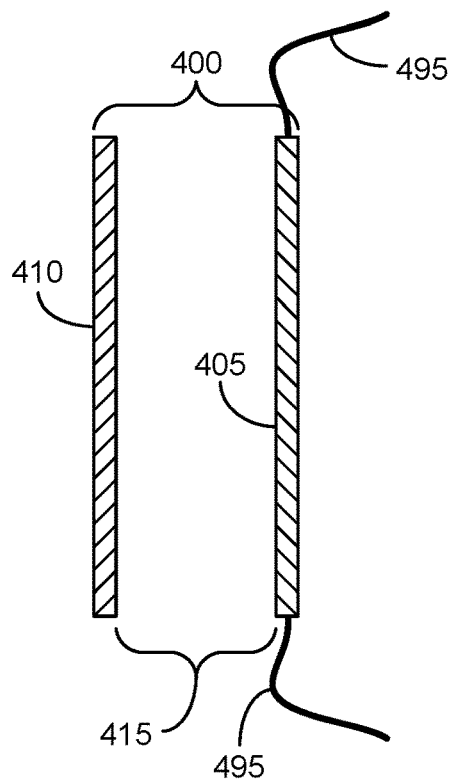
FIG. 4A and FIG. 4B provide cross-sectional illustrations of example Casimir resistor devices, in accordance with at least some embodiments.
Figure 4B:
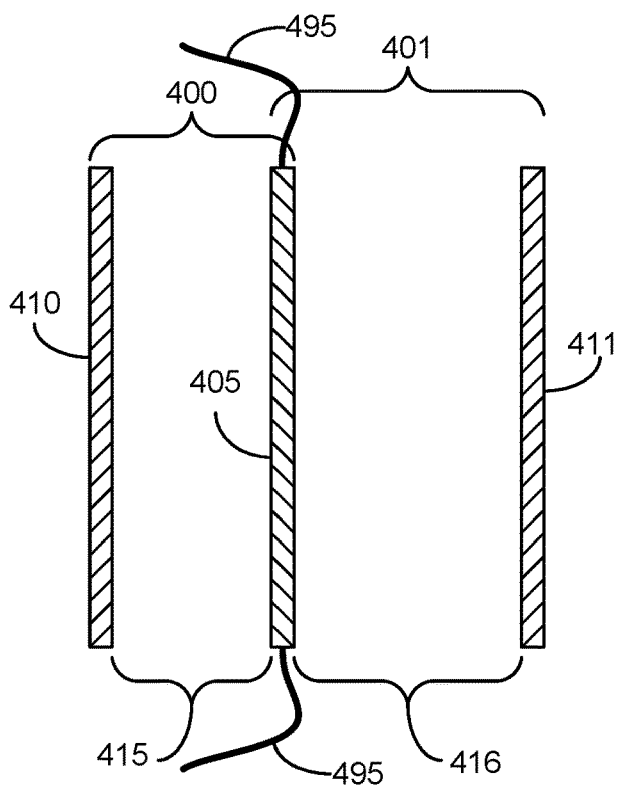

FIGS. 4A and 4B provide a schematic cross-sectional illustrations of a resistor comprising a thin conductive film 405. Electrical contacts can be made to the top and bottom of the conductive film 405, as depicted by electrical leads 495. A Casimir cavity 400 can be formed on one side of the conductive film 405, as shown in FIG. 4A. The Casimir cavity 400 is formed by the conductive film 405 and a reflecting layer 410, with an optically transmissive region in between, at gap 415. The conductive film 405 can comprise a metal, for example, such as including chromium, silver, palladium, and aluminum, among others. The reflecting layer 410 can comprise metals or dielectrics, for example. The transmissive region at gap 415 can be transmissive in at least part of the spectral region in which the Casimir cavity 400 suppresses modes. Example materials for the transmissive region include, but are not limited to, a polymer, such as a polyimide or PMMA, an oxide, such as $SiO_2$ or $Al_2O_3$, a vacuum, or a gas, liquid, or liquid-crystal filled gap 415.

Instead of using a single Casimir cavity 400, a second Casimir cavity 401 can be formed on the other side of the conductive film 405, as shown in FIG. 4B. Second Casimir cavity 401 can be similar to Casimir cavity 400, such as formed from conductive film 405 and a second reflecting layer 411, with an optically transmissive region in between at gap 416. Gap 415 in Casimir cavity 400 and gap 416 in Casimir cavity 401 can have the same or different thickness dimensions. The combination of Casimir cavity 400 and second Casimir cavity 401 can be useful for further suppressing even more resistor noise due to zero-point energy fluctuations.

In place of the thin film resistors shown as Casimir resistors in FIGS. 4A and 4B, the resistors can be formed from other structures in which a Casimir cavity is adjacent to or adjoining one or both sides. These include metal/insulator/metal devices, metal/multi-insulator/metal devices, metal/insulator/semiconductor devices, semiconductor layers, graphene, other two-dimensional semiconductors, Schottky diodes, superconductor/insulator/superconductor devices, vacuum diodes, and other electronic device structures.

One issue with the parallel-plate electrode devices listed above (metal/insulator/metal devices, metal/multi-insulator/metal devices, metal/insulator/semiconductor devices, semiconductor layers, Schottky diodes, superconductor/insulator/superconductor devices) adjacent to or adjoining Casimir cavities is that the suppressed zero-point fields are orthogonal to the direction of current flow. Specifically, for the orientation shown in FIGS. 4A and 4B, the electric fields for the suppressed modes are in the vertical direction and the current flow is in the horizontal direction. It might seem that to enhance the effect of the Casimir cavity on the resistor current fluctuations, both the suppressed zero-point fields and the current flow should be in the same direction.

However, in such devices the proximity of a Casimir cavity can still reduce the resistor noise due to zero-point energy fluctuations. The reason is that the parallel-plate resistors (and diodes too) make use of electron and hole transport across the gap where the zero-point fields normal to the surface affect the transport of electrons and holes in a direction normal to the surface. These are "photon" devices, in that each absorbed photon excites an electron or hole that contributes to the currents. On the other hand, in the thin film resistors of FIGS. 4A and 4B, the direction of current flow is normal to the Poynting vector, and is in the plane of the electric fields from the zero-point field. The currents in these types of resistors do not result from photon-excited particles transported across a gap, but rather from the electric fields in the zero-point field. For such "field" devices, the configuration shown in FIGS. 4A and 4B is correct for effective suppression of zero-point field-induced fluctuations in the resistor. In particular, the electric field components polarized in the vertical direction in FIGS. 4A and 4B can give rise to fluctuation currents between the two leads in the metal film resistor.

Casimir Resistor/Free-Space Resistor Circuit.

Figure 5A:
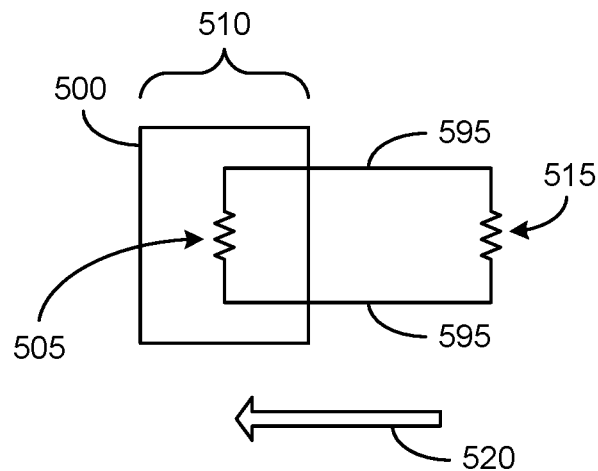
FIG. 5A and FIG. 5B provide schematic diagrams of example circuits for transferring energy between different regions, in accordance with at least some embodiments.

One way to make use of a flow of energy induced by an asymmetry in zero-point energy densities is with interconnected resistors. FIG. 5A provides a schematic diagram of an example circuit of interconnected resistors, where a first resistor 505 is positioned inside or adjacent to a Casimir cavity 500 (i.e., where first resistor 505 and Casimir cavity 500 together comprise or correspond to a Casimir resistor 510), as described above, and a second resistor 515 is a free-space resistor, such as without an adjoining Casimir cavity. Here, the resistor power described by Eq. 5 will flow dominantly to the Casimir resistor 510, as schematically depicted by arrow 520 in FIG. 5A. The electrical connections 595 between the first resistor 505 and the second resistor 515 can limit the flow of energy induced by the asymmetry, so a high-frequency transmission line, capable of carrying terahertz signals, may be useful for the electrical connections 595. It will be appreciated that the resistors 505 and 515 do not have to be resistors, per se, but simply electric devices that exhibit some resistance, such as diodes, transistors, lamps, heating elements, or other circuit components, electrical or electronic devices. Under some circumstances, capacitors can be used in place of one or both of the resistors 505 or 515 to accomplish zero-point energy signal transfer.

Figure 5B:
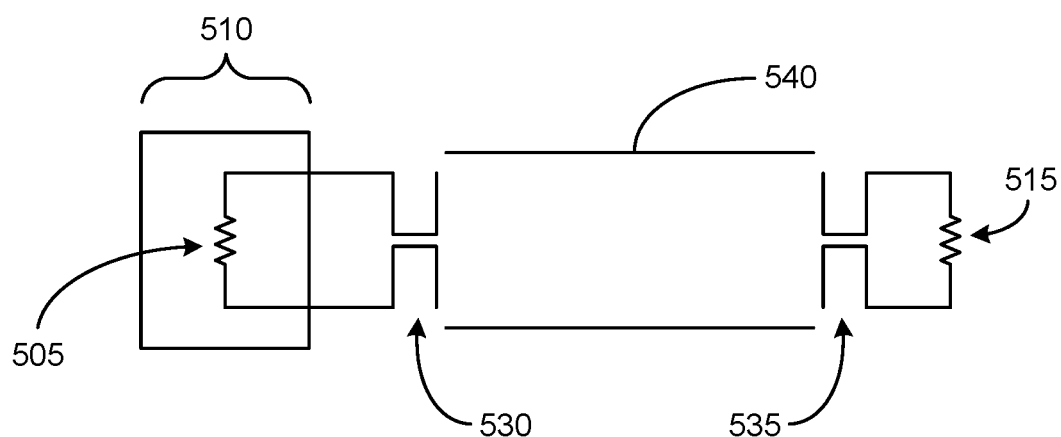

Because metals become increasingly resistive with increasing signal frequency, the transmission line used for electrical connections 595 between resistors 505 and 515 usually must be short, such as less than 1 mm. For some of the applications described herein, having a larger distance between the resistor pairs may be desirable. In some cases, electrical connections 595 can comprise superconductors, in which case a length of the electrical connections 595 may not be limited. In some other examples, an increased distance between resistors 505 and 515 can be accomplished by connecting each resistor (Casimir resistor or free-space resistor) to an adjacent antenna, as depicted in FIG. 5B. Here Casimir resistor 510 is electrically connected to a first antenna 530, with second resistor 515 electrically connected to a second antenna 535. First antenna 530 and second antenna 535 can be optically coupled to one another to allow for exchange of signals between the two resistors via transmission. In FIG. 5B, the signals are exchanged through a waveguide 540, which is optional, or the signals may be exchanged through free space. In some cases, multiple antenna pairs can be used, such as where there is a one-to-one correspondence between each pair of resistor-antenna units. Optionally, there can be an array of resistor-antenna units of one type exchanging signals with an array of resistor-antenna units of the other type, such as through free space. In many cases, the antennas, resistors, Casimir cavities, etc., can be very small, so an array can include many units, such as up to 100,000,000 units per square centimeter.

Casimir resistors can be useful for a variety of different applications, as described in more detail below. Examples include, but are not limited to energy harvesting, electronic refrigeration, electronic heating, signal communication, electronic noise reduction, and zero-point energy detection.

Figure 6A:
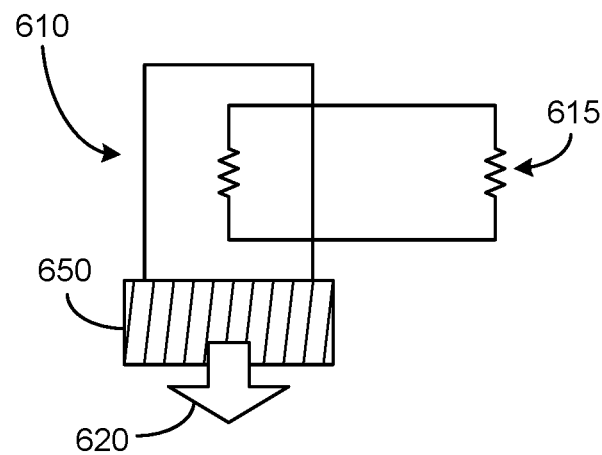
FIG. 6A and FIG. 6B provide schematic diagrams of example circuits for transferring thermal energy between different regions, in accordance with at least some embodiments.
Figure 6B:
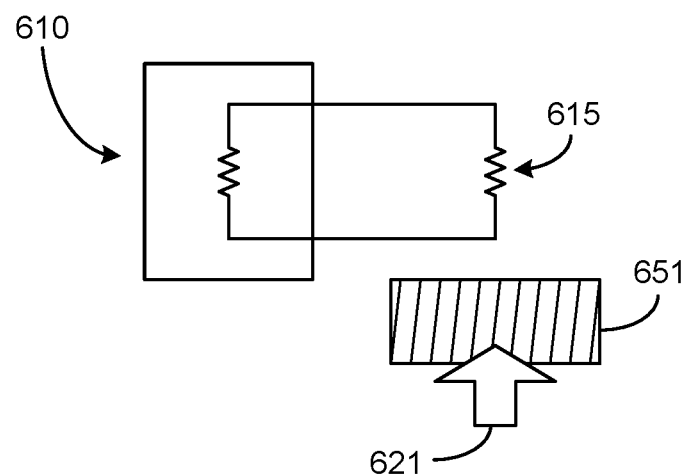

Refrigerator and heater. The examples shown in FIGS. 5A and 5B are useful for transferring energy between free-space resistors and Casimir resistor. In some cases, electric refrigerators and electric heaters can be provided by free-space resistors and Casimir resistor. As shown in FIG. 6A, a Casimir resistor 610 is coupled to a thermal sink 650 held at ambient temperature, which can fix the temperature of the Casimir resistor 610. Thermal sink 650 can correspond to a device, structure or other element used to absorb and dissipate heat to the environment, as schematically depicted by arrow 620. The transfer of energy between Casimir resistor 610 and free-space resistor 615 can result in cooling the free-space resistor 615 (i.e., absorption of ambient heat by free-space resistor 615), providing an electric refrigerator. On the other hand, as shown in FIG. 6B, when the temperature of the free-space resistor 615 is held fixed, such as by using a thermal source 651 at ambient temperature, the result will be to heat the Casimir resistor 610, providing an electric heater. Thermal source 651 can correspond to a device, structure or other element used to absorb and provide ambient heat, as schematically depicted by arrow 621. In some cases, the heat may be used to heat the region where the Casimir resistor 610 is, or the heat may be used in conjunction with another device, such as a heat engine, to provide electrical or mechanical power. It will be appreciated that the configurations depicted in FIG. 5A or 5B, or variations thereof (e.g., including an array of or multiple antenna pairs), can be used in the refrigerator or heater.

Communication device. The modulation of quantum vacuum noise can be used for communications. Motion or modulation of the Casimir cavity adjoining a resistor or other electronic device can modulate the noise, which can be transmitted to a distant detector for communications. The modulation of the Casimir cavity can be accomplished, for example, by vibrating it with an ultrasonic wave, or electronically changing the reflection or transmission characteristics of the Casimir cavity. Communication of the noise can be performed using one or more antenna pairs, such as described above with reference to FIG. 5B.

Electronic noise reducer. Because the placement of a Casimir cavity adjoining an electric device reduces the net zero-point energy fluctuations incident onto that device, it can be used to reduce the high-frequency electronic noise in the device. Such a configuration may correspond to that shown in FIG. 3 where Casimir cavity 300 is adjacent to a first electric device 350. For example, in a high-frequency detector, intrinsic electronic noise can degrade the sensitivity, and the incorporation of an adjoining Casimir cavity can reduce the noise and increase the detector sensitivity. In addition to detectors, this can apply to amplifying devices like transistors, rectifying devices like diodes, optical, thermal, and ultrasonic detectors. The Casimir cavity can be on one or more sides of the device, or the device can be placed inside a Casimir cavity, for example.

Detector. Because a Casimir resistor has a reduced zero-point energy noise level, the difference between its average output and that of a free resistor can provide a measure of the zero-point energy noise. This combination can therefore advantageously function as an average zero-point energy fluctuation detector.

Circuits for Casimir Resistor and Casimir Diode Energy Harvesting.

At each operating voltage, diodes have an effective resistance associated with them. Therefore, when a diode is connected in a circuit to a resistor, both the diode and the resistor produce zero-point fluctuation noise currents. Under normal conditions (i.e., in the absence of a zero-point-energy-density-reducing structure, such as a Casimir cavity), each element emits and receives the same noise power, and so there is no net flow of power.

On the other hand, if a Casimir cavity is incorporated onto the diode (a "Casimir diode", discussed in more detail below), the zero-point fluctuation noise current emitted from it is reduced. In that case, there can be a net flow of noise power from the free-space resistor to the Casimir diode. Such a configuration is schematically depicted in FIG. 7A, where a diode 705 is positioned adjacent to a Casimir cavity 700 (i.e., where diode 705 and Casimir cavity 700 together comprise or correspond to a Casimir diode 710) and where resistor 715 is a free-space resistor, such as without an adjoining Casimir cavity.

The diode 705 can be used to rectify the zero-point energy noise current from the resistor 715 and produce a DC voltage output. The DC voltage output can be used to power a load 720, as also depicted in FIG. 7A, even in the absence of external sources of illumination. In general, diode 705 may correspond to any structure that serves as a one-way valve or rectifier, which can serve to limit the flow of charge carriers in one direction.

To limit losses, the electrical connections 795 between the resistor 715 and the diode 705 must be capable of carrying terahertz signals, e.g., a high-frequency transmission line. An optional low-pass filter 725 is shown, and is useful for preventing the flow of noise current from or to the load. In some examples, low-pass filter 725 can provide a cutoff frequency of below 30 THz. In in most implementations, such as when the load is not connected by a high frequency transmission line, low pass filter 725 may not be needed because a conventional electrical conductor can serve as a suitable low-pass filter. In some cases, electrical connections 795 can comprise superconductors, in which case low-pass filter 725 can be useful.

Figure 7A:
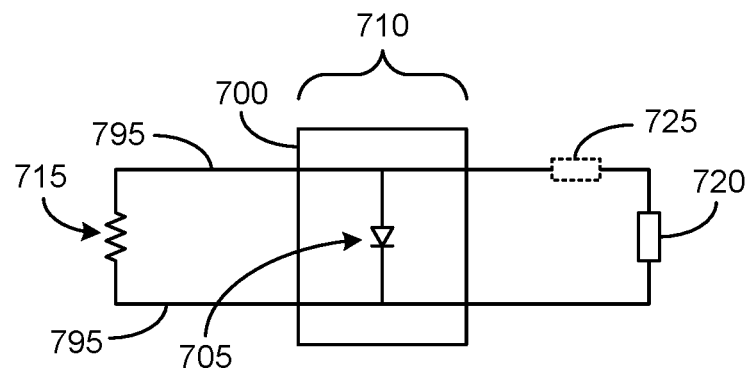
FIG. 7A and FIG. 7B provide schematic diagrams of example circuits for harvesting noise power, in accordance with at least some embodiments.
Figure 7B:
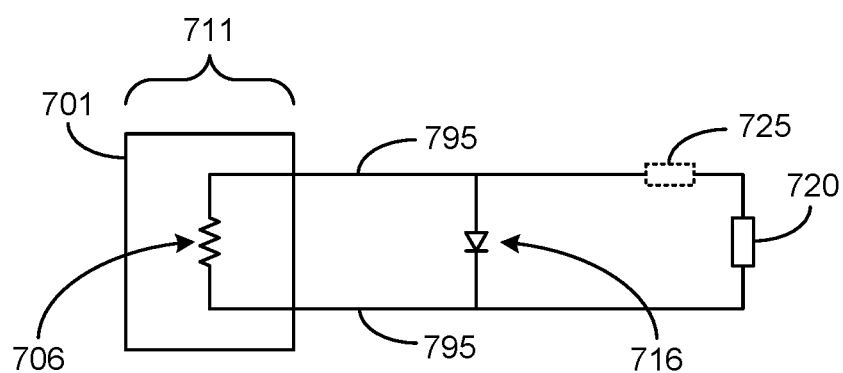

As an alternative to the configuration depicted in FIG. 7A, FIG. 7B shows a circuit comprising a free-space diode 716 and a Casimir resistor 711 (i.e., where resistor 706 and Casimir cavity 701 together comprise or correspond to Casimir resistor 711). Electrical connections 795 are shown between resistor 706 and free-space diode 716. Here the zero-point fluctuation noise current from the resistor 706 is reduced, and there is a net flow of noise power from the free-space diode 716 to the resistor 706. The free-space diode 716 can rectify this excess noise power and produce a DC voltage output that can be used to power a load 720. The other characteristics of the circuit depicted in FIG. 7A apply to FIG. 7B.

Additionally, a similar function is provided with a circuit comprising a free-space diode and a Casimir diode. In such a circuit, each diode rectifies the difference in noise between the free-space diode and the Casimir diode, but, because there are two diodes, the noise voltage to be rectified is split between the two, which decreases the rectification efficiency. On the other hand, this circuit can have an advantage over the circuits depicted in FIGS. 7A and 7B in that there can be a better impedance match between the two components, and hence an improved power transfer.

For the cases depicted in both FIGS. 7A and 7B, it will be appreciated that any of the configurations depicted in FIG.

5A or 5B, or variations thereof (e.g., including an array of or multiple antenna pairs) can be used, such as where one of the resistors shown in FIG. 5A or 5B is replaced by diode coupled to a low-pass filter and load.

Casimir Diodes.

A conductor/insulator/conductor diode is a thin-film device in which the insulator is sufficiently thin, such as from 0.5 nm to 10 nm, or generally below 100 nm, in thickness, to facilitate electron (or hole) tunneling from one conductor to the other through the insulator. In general, the two conductors can be any two metals, for example, and can be different, to provide an asymmetry in barrier heights and hence an asymmetry in the tunneling characteristic in one direction versus the other, and hence provide an asymmetric diode current-voltage characteristic. Other conductive materials besides metals may also be used. The diodes may also or alternatively incorporate multiple insulators to provide an asymmetry and/or enhance the current-voltage nonlinearity. In the case of multiple insulators, the conductors do not have to be different to facilitate the formation of a diode.

Figure 8A:
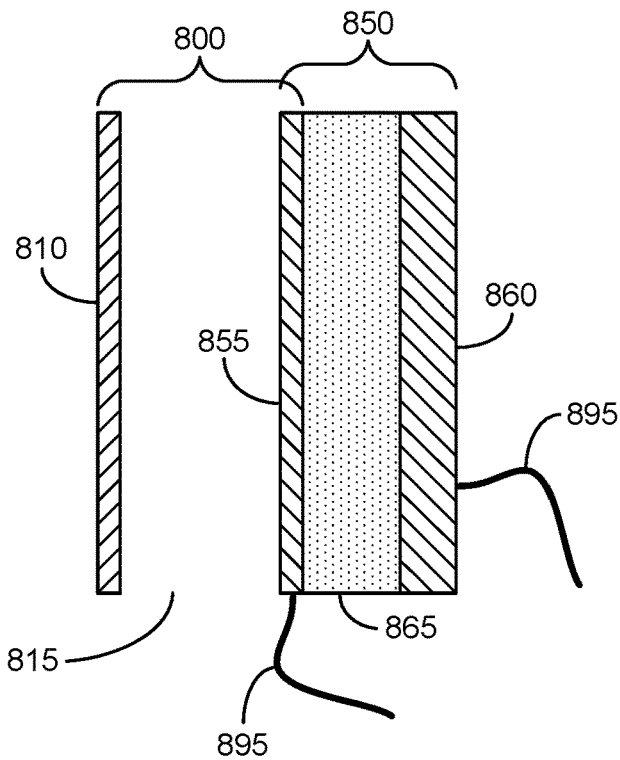
FIG. 8A and FIG. 8B provide cross-sectional illustrations of example Casimir diode devices, in accordance with at least some embodiments.

FIG. 8A provides a schematic cross-sectional diagram of a diode 850 comprising a first conductive layer 855, an electrically insulating layer 865, and a second conductive layer 860, in which a Casimir cavity 800 is formed on one side of the diode 850. The Casimir cavity 800 is formed in between the first conductive layer 855 that forms one side of the diode and a reflecting layer 810, with a gap 815 in between, which may comprise a transmissive material, for example. Electrical leads 895 are connected to the two conductive layers 855 and 860 that surround the electrically insulating layer 865. Electrically insulating layer 865 can comprise one electrically insulating layer or more than one electrically insulating layer. The first conductive layer 855 of the diode 850 adjacent to or comprising a portion of the Casimir cavity 800 is sufficiently thin for hot electron emission into the first conductive layer 855 from the outer surface through the first conductive layer 855 and into the electrically insulating layer 865. The first conductive layer 855 and the second conductive layer 860 can comprise a variety of conductors that are known to form conductor/insulator/conductor diodes (or metal/insulator/metal diodes), including, but not limited to, nickel, niobium, palladium, or aluminum. The electrically insulating layer 865 can comprise many possible options, such as nickel oxide, niobium pentoxide, titanium oxide, and aluminum oxide. In some cases, electrically insulating layer 865 can comprise multiple sub-layers of different electrically insulating materials. The reflecting layer 810 can comprise a metal or a dielectric reflector, for example. The material in gap 815 can be transmissive in at least a part of the spectral region in which the Casimir cavity suppresses modes. For example, if the critical dimension (gap 815 between reflecting layer 810 and first conductive layer 855) is 0.15 µm and the index of refraction of the material in gap 815 is 1.6, then the approximate suppressed wavelengths will be equal to or longer than 0.15 µm×2×1.6=0.48 µm. The material in gap 815 can comprise a polymer, such as a polyimide or PMMA, an oxide, such as $SiO_2$ or $Al_2O_3$, vacuum, or a gas, liquid, or liquid crystal, among others.

Figure 8B:
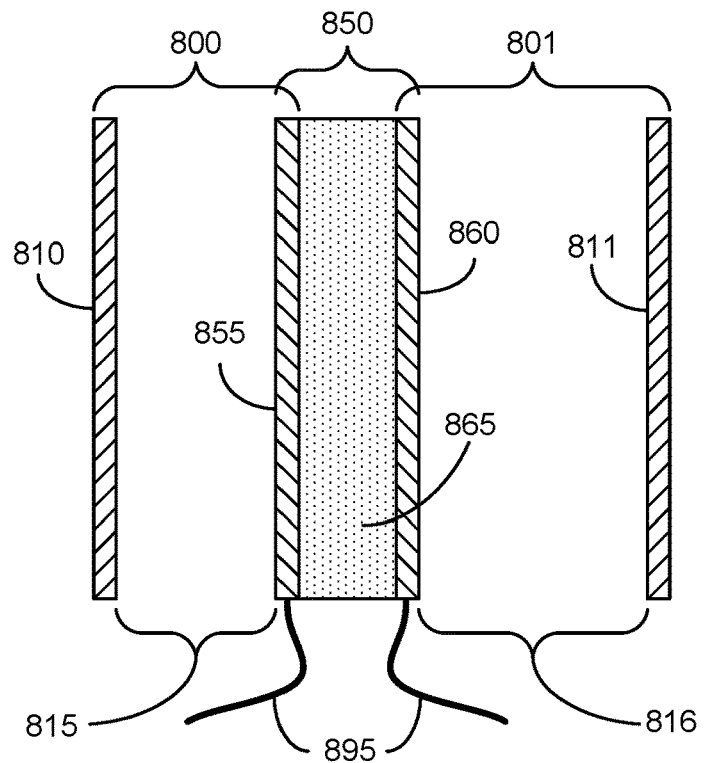

Alternatively, the Casimir diode can be formed with Casimir cavities on both sides, as depicted in FIG. 8B, which provides a schematic cross-sectional diagram of a diode 850, a first Casimir cavity 800 on one side of the diode 805 and a second Casimir cavity 801 on the opposite side of the diode 850. Gap 815 in Casimir cavity 800 and gap 816 in Casimir cavity 801 can have the same or different thickness dimensions. Diode 850 comprises a first conductive layer 855, an electrically insulating layer 865, and a second conductive layer 860. In this case, both conductive layers 855 and 860 of the diode 850 are sufficiently thin for hot electron emission through the conductive layers 855 and 860 from their outer surfaces and across the electrically insulating layer 865.

The free-space diode 716, described above with respect to FIG. 7B can be similar in structure to the Casimir diodes described above in FIGS. 8A and 8B, but without the Casimir cavities 800 and 801.

Conductor/insulator/conductor diodes have been shown in FIGS. 8A and 8B because they exhibit ultra-high frequency tunneling, but other diodes can alternatively be used for both the Casimir diode 710 and for the free-space diode 716 depicted in FIGS. 7A and 7B. Examples include geometric diodes, Schottky diodes, and metal/insulator/semiconductor (MIS) diodes, Mott diodes, quantum well diodes, ballistic diodes, carbon nanotube diodes, superconductor/insulator/superconductor (SIS) devices, and other diodes known to those skilled in the art.

Implementation of a Casimir Resistor and Casimir Diode Energy Harvesting.

One challenge in harvesting the energy from zero-point energy fluctuations using Casimir resistors and Casimir diodes is the loss in power in transferring the multi-terahertz signal between the diode and the resistor in the circuits shown in FIGS. 7A and 7B. The loss can be large even for distances as short as 1 µm. In addition, the RC losses due to the capacitance of high-frequency diodes, such as metal/insulator/metal diodes, can greatly reduce the amount of fluctuation current that is rectified. One technique to address the challenge is to make use of the antenna pairs described with respect to the two resistor in FIG. 5B. Another technique that does not require the use of antennas is presented here to mitigate the effects of power loss due to lead resistance for multi-terahertz signals, and provide high-frequency diodes having low capacitance.

The Casimir resistors described above include those incorporating metal film resistors, but these devices can alternatively incorporate graphene films instead of metal films. An analysis of graphene optical properties shows that it can conduct current at very high frequencies, although the resistance may still be high for current conduction over paths having a length on the order of one micron or more.

Figure 9A:
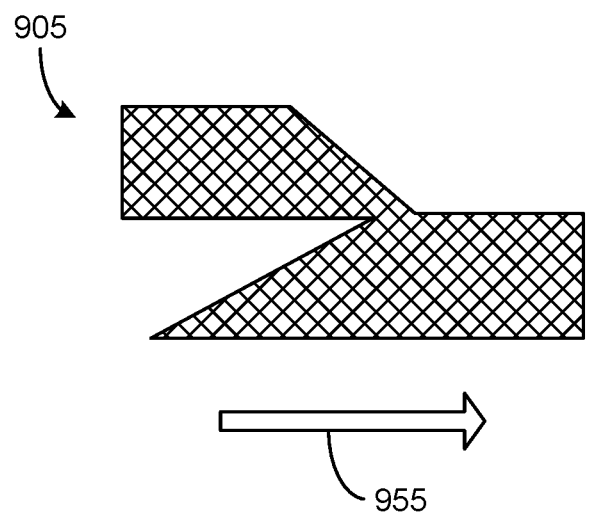
FIG. 9A provides a schematic illustration of a top view of an example geometric diode and FIG. 9B provides a schematic cross-sectional illustration of an example Casimir diode device comprising a geometric diode, in accordance with at least some embodiments.

Graphene films can also be used for thin film diodes. An example is a graphene geometric diode, which is a planar structure, and therefore has intrinsically lower capacitance than parallel plate devices, such as metal/insulator/metal diodes. A particular configuration of a geometric diode called the Z-diode is depicted in FIG. 9A, which shows a top view. The geometric diode comprises a graphene film 905 on an insulating substrate patterned into an asymmetric shape that that provides preferential motion of charge carriers in one direction over the other, as indicated by arrow 955. The size (e.g. lateral dimensions) of the geometric diode can be on the order of 1 µm, but it can be smaller.

Figure 9B:
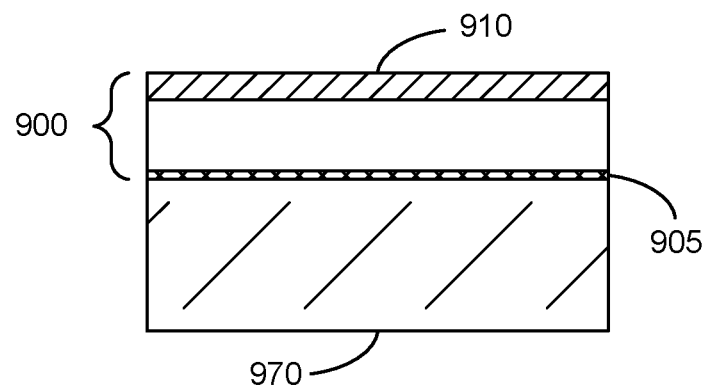

By situating a Casimir cavity on one or both sides of the geometric diode, a Casimir diode is formed, as depicted in FIG. 9B, which shows a side view. As with other Casimir cavities described herein, the spacing between reflective elements of the Casimir cavity 900 determines the spectral range of suppressed modes, and to suppress higher energy modes the Casimir cavity 900 should be thinner. The outer face of the Casimir cavity 900 comprises a reflector 910, such as a layer of aluminum. The inner face corresponds to the graphene film 905, in the regions where the graphene film 905 is situated, and the substrate 970 in regions where the graphene film is not. Even in regions where the graphene film 905 is situated, because it reflects or absorbs only a small fraction of the incident radiation, the reflection resulting from the step in refractive index at the interface to the substrate 970 can dominate the reflectivity of the inner face. For example, if the substrate 970 is boron nitride having an index of refraction between 1.6 and 2.2, and the Casimir cavity 900 contains a medium have an index of 1.5, the reflectivity is between 0.1% and 3.6%, ignoring the effect of the graphene film 905 on the reflectivity. The reflectivity of the inner face can be enhanced in multiple ways. For example, one way is to use free space rather than a medium in the Casimir cavity 900, which reduces its refractive index from approximately 1.5 to 1. Another way is to use a substrate 970 having a larger refractive index than 1.6-2.2. Another way is to have a very thin substrate, e.g., 5 nm of boron nitride, deposited on a material having high reflectivity, such as a metal or high-index semiconductor.

Figure 10A:
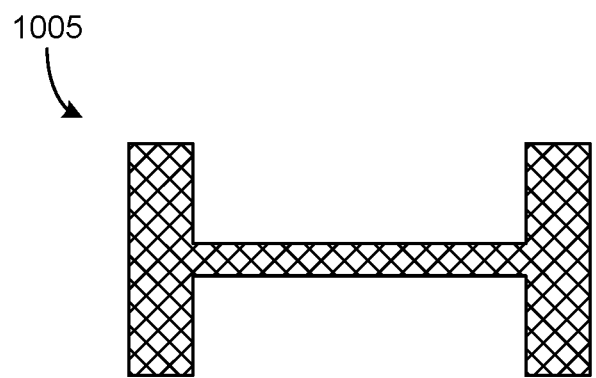
FIG. 10A provides an illustration of a top view of an example thin film resistor and FIG. 10B provides a cross-sectional illustration of an example Casimir resistor device comprising a thin film resistor, in accordance with at least some embodiments.
Figure 10B:
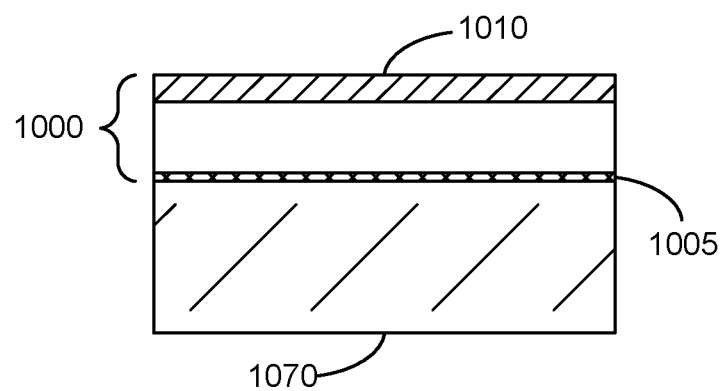

A Casimir resistor can be formed from a graphene layer that is similar to that of the Casimir diode, but not patterned into an asymmetric shape. An example of such a graphene layer 1005 is depicted in FIG. 10A (top view) and FIG. 10B (side view). A Casimir cavity 1000 is shown with a reflector 1010 and graphene layer 1005, and supported by a substrate 1070. The same reflection enhancements that were described for the geometric diode used to form Casimir diode can be used for the Casimir resistor.

Figure 11A:
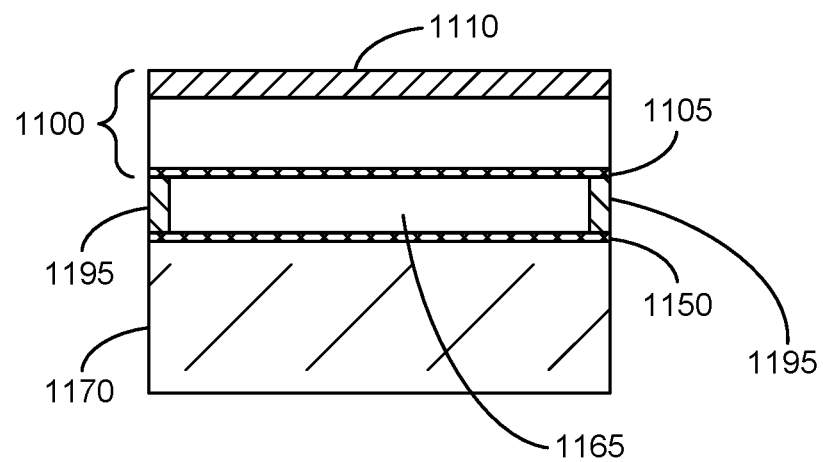
FIG. 11A provides a cross-sectional illustration of an example noise power harvesting device comprising a geometric Casimir diode and a thin film resistor and FIG. 11B provides an overhead layout view of the noise power harvesting device of FIG. 11A, in accordance with at least some embodiments.
Figure 11B:
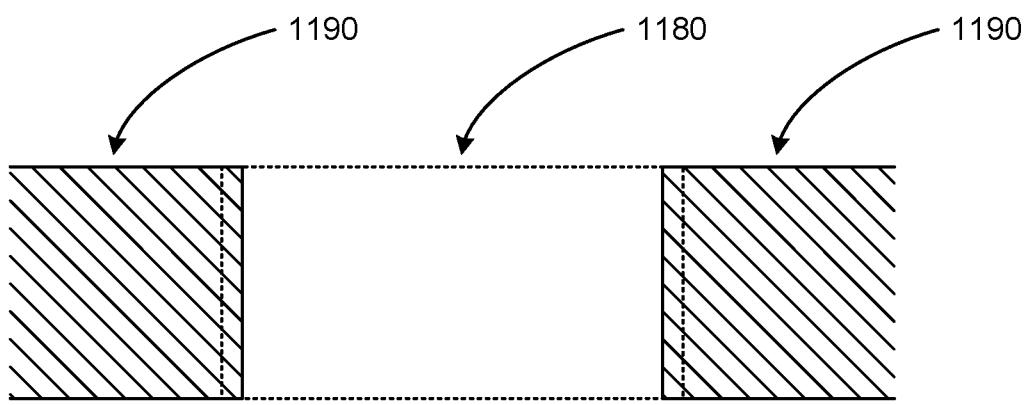
FIG. 11C provides a cross-sectional illustration of an example noise power harvesting device comprising a Casimir resistor and a geometric diode and FIG. 11D provides an overhead layout view of the noise power harvesting device of FIG. 11C, in accordance with at least some embodiments.

As described above, a challenge in coupling a Casimir diode to a resistor, or a Casimir resistor to a diode, for energy harvesting is that at multi-terahertz frequencies there can be large conductive losses in the electrical leads between the two devices. This problem is mitigated in the examples depicted in FIGS. 11A, 11B, 11C, and 11D. The example in FIGS. 11A and 11B comprises a graphene geometric Casimir diode 1100 coupled to a graphene resistor 1150 by electrical leads 1195. FIG. 11A provides a side view, showing substrate 1170, graphene geometric diode 1105, reflector 1110, graphene resistor 1150, and spacer layer 1165 (e.g., comprising an insulator), and FIG. 11B shows a top layout view showing the position 1180 of the active elements (i.e., graphene geometric Casimir diode 1100 and graphene resistor 1150) and the position 1190 of the electrical leads 1195. The example in FIG. 11A corresponds to the circuit shown in FIG. 7A, but without the load and low-pass filter.

Figure 11C:
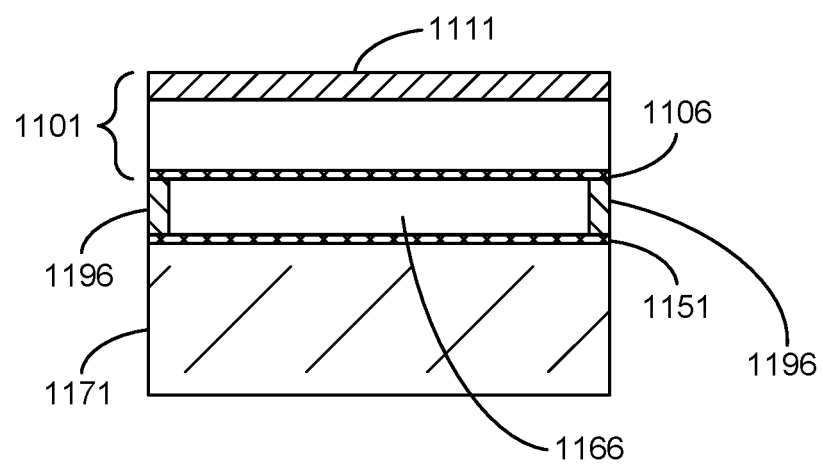
Figure 11D:
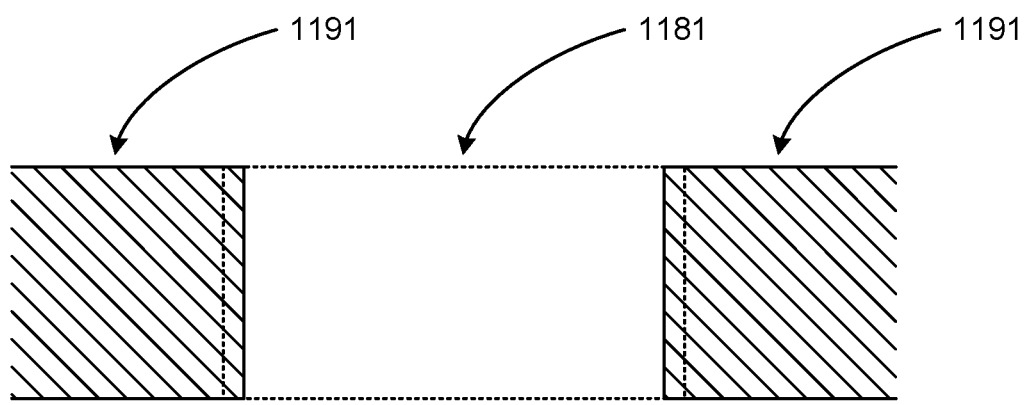

The example in FIGS. 11C and 11D comprises a graphene Casimir resistor 1101 coupled to a graphene geometric diode 1151 by electrical leads 1196. FIG. 11C provides a side view, showing substrate 1171, graphene resistor 1106, reflector 1111, graphene geometric diode 1151, and spacer layer 1166 (e.g., comprising an insulator), and FIG. 11D shows a top layout view showing the position 1181 of the active elements (i.e., graphene Casimir resistor 1101 and graphene geometric diode 1151) and the position 1191 of the electrical leads 1196. The example in FIG. 11C corresponds to the circuit shown in FIG. 7B, but without the load and low-pass filter.

These examples have the advantage that the diodes and resistors are very close to each other, separated, for example, only by an opaque insulator, so that the electrical leads need to carry the high frequency current over a distance of only the thickness of the opaque insulator, which can be a fraction of a micron, for example.

In these examples, the electrical leads can make direct contact to the graphene devices, in which case the material contact must make a low resistance contact to graphene, for example. One such material is titanium. Alternatively, the leads can comprise a high conductivity material, such as copper, and only the region in contact with the graphene needs to comprise a low-resistance contact material. As shown in FIGS. 11B and 11D, the electrical leads extend out from the device and carry the rectified DC power to the load, as shown in FIGS. 7A and 7B. The opaque insulator may be sufficiently insulating to be substantially less conductive than the graphene, and sufficiently opaque or reflecting to isolate the effect of the Casimir cavity dominantly to the upper graphene layer. The insulator can comprise a multi-layer structure including at least one insulating layer, such as an oxide, and one reflective material, such as a metal. Alternatively, the insulator can comprise a material that combines both properties, such as an intrinsic semiconductor. For example, hydrogenated amorphous silicon is sufficiently insulating and has an absorption depth of approximately 100 nm or less for light having a photon energy of 2 eV or more. This would allow the leads between the two graphene layers to be only 100 nm in length.

In one example, each device pair, corresponding to the examples described above with respect to FIG. 7A or FIG. 7B, may produce 50 nW, for example. With the examples described above with respect to FIGS. 11A-11D, the power can be greater because the graphene geometric diode can rectify high frequencies up to and greater than 1 PHz, corresponding to a power of 660 µW, for example. Also, the power can be greater because the proximity of the diode and resistor provide for reduced conduction loss. For a 10% rectification efficiency and a conduction power loss of 85%, the output power can be 10 µW per device pair, for example. For device arrays such as indicated by the connection scheme of FIG. 12 described in further detail below, with device pairs arrayed on a pitch of 10 µm, a 10 cm×10 cm array can comprise $10^8$ devices, providing a DC power output of 1 kW, for example One of the challenges of rectification in the terahertz frequency domain is due to losses in transmission lines. A useful feature of the examples described above is that the diode and resistor are sufficiently close to each other to allow sufficiently low loss in the high frequency current carried between the diode and the resistor to make the system practical for energy harvesting. One way to circumvent at least some of these losses and contact resistance loss is with the use of capacitor coupling. For Casimir diode/resistor pairs, the diodes can be formed on a substrate in one layer, and the resistors can be formed on a different layer, separated by a spacing layer, such as comprising an insulator. The power can be coupled between each resistor and each diode in a diode/resistor pair though electrodes on opposing sides of the separation insulator. This electrode sandwich is a capacitor that, at terahertz frequencies, will have a very low impedance and therefore can couple the signal with little loss. Such configuration can be similar to that shown in FIG. 7A, where capacitors interrupt the electrical connections 795 between the free-space resistor 715 and the diode 705, or shown in FIG. 7B, where capacitors interrupt the electrical connections 795 between the resistor 706 and the free-space diode 716.

It will be appreciated that the embodiments provided with reference to FIGS. 9A-11D are merely examples of one set of implementations and are not intended to be limiting. Other materials can be used for the diode and resistor, such as $MoS_2$ and metals, and other configurations can be used for the diode besides a geometric diode. Furthermore, the system could be inverted, with the Casimir cavity adjacent to the substrate, or formed into a vertical structure, for example.

Casimir Resistor and Casimir Diode Energy Harvesting.

The amount of power available is a strong function of the frequency cutoff for the diode. The mean-square voltage for zero-point energy noise in a resistor, using Eq. 5, is $$\langle V \rangle^2 = \int_{f_1}^{f_2} S(f) df = \int_{f_1}^{f_2} 2Rhf df = Rhf^2 \Big|_{f_1}^{f_2}. \qquad \text{Eq. 6}$$

For integration from DC (i.e., $f_1=0$), the power available at a matched load is $$\frac{\langle V \rangle^2}{R} = hf_2^2. \qquad \text{Eq. 7}$$

This represents the maximum power available from a Casimir resistor connected via a high-frequency transmission line to a diode, as depicted in FIG. 7B, such that the diode has an equivalent resistance equal to that of the Casimir resistor. The same power would be available when a free-space resistor is connected via a high-frequency transmission line to a Casimir diode, as shown in FIG. 7A.

For a diode and transmission line having a cutoff of 1 THz, the power given by Eq. 7 is 0.66 nW. For available diodes, that power level is too low for efficient rectification. For a 30 THz cutoff frequency, the power is 0.60 and for a 1 PHz ($10^{15}$ Hz) cutoff, the power is 0.66 mW. In some cases, the DC power generated may be less than that given by Eq. 7 because of rectification losses and transmission losses.

This power can be harvested continuously with circuits like those shown in FIGS. 7A and 7B. The power available to the load from each diode-resistor pair is small. To achieve large power, multiple devices can be configured into an array, such that the power from each diode/resistor pair is added to provide a higher total power output from the array. One example for such an array is shown in FIG. 12.

Figure 12:
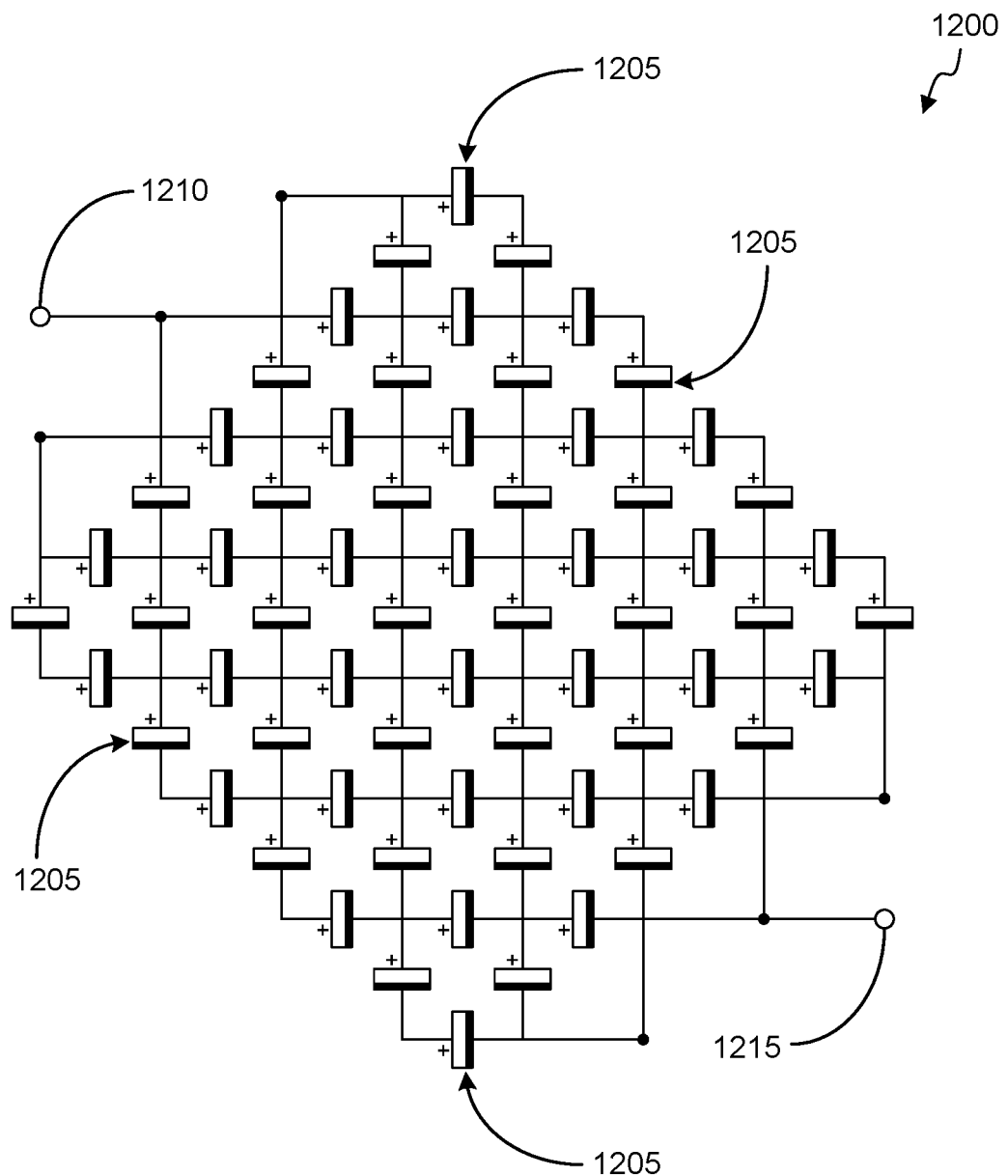
FIG. 12 provides a schematic circuit diagram of an example device array, in accordance with at least some embodiments.

In FIG. 12, array 1200 is illustrated as an array of individual devices 1205 connected in a series and parallel combination, with two output electrodes 1210 and 1215. Each device 1205 in FIG. 12 represents any suitable device or device pair, such as a Casimir diode in parallel with a free resistor, or a Casimir resistor in parallel with a free diode. A load is not shown in FIG. 12 but may be connected between electrodes 1210 and 1215. The load can correspond to any suitable electrical device, such as, and without limit, a battery, a motor, a light-generating device, an electrolysis system to produce chemical fuel, a communication device, a computer, a circuit component, an electric device, or any combination thereof.

In the 64-device array shown, the DC output voltage between electrodes 1210 and 1215 is the sum of voltages along a series path between the output electrodes. In this case, there are 8 devices 1205 in series, and so if each device provides 100 mV at its maximum power point, the total output voltage is 800 mV, for example. The current is proportional to the number of devices 1205 in parallel. In this case, there are 8 devices in parallel. For example, if each device 1205 produces 500 nA at its maximum power point, the total output current is 4 µA. The total power output in this configuration is calculated (using P=IV) as 800 mV×4 µA or 3.2 µW.

It will be appreciated that these values are provided merely as an example and are not intended to be limiting on the output voltage or current provided by any particular device array. Further, it will be appreciated that the 64-device array with 8 devices in series and 8 devices in parallel is also an example and that other array sizes and configurations can be used. For example, linear arrays, square arrays where the number of devices in series and in parallel is the same, rectangular arrays where the number of devices in series and in parallel is different, or non-regular arrays can be used.

Although linear arrays (i.e., 1-dimensional arrays of only series arranged devices 1205 or only parallel arranged devices 1205) are contemplated, advantages can be obtained by using devices 1205 with a series and parallel combination. For example, in the event of a short circuit across any single device 1205 in array 1200, the voltage between electrodes 1210 and 1215 is only reduced by a small amount, rather than completely (i.e., to 0 V), as would be the case in an only parallel constructed array with a short circuit across any one device. Similarly, in the event of a disconnect or broken circuit path at any single device 1205 in array 1200, the current between electrodes 1210 and 1215 is only reduced by a small amount, rather than completely (i.e., to 0 A), as would be the case in an only series constructed array with a disconnect or broken circuit path.

Each device 1205 in array 1200 can have any suitable dimensions and physical arrangement. As an example, the devices can be arranged in a planar configuration across an area, such as similar to that depicted in FIG. 12. In one specific example, the area taken up by a diode and a resistor in each devices 1205 can have an area of 1 µm² each (e.g., 1 µm×1 µm). For an array having a 5 µm pitch (25 µm² for each diode-resistor pair) to allow for interconnects, a 10 cm×10 cm array can comprise 400 million diode-resistor pairs. For the voltages and currents per device given above, which is 50 nW per device pair, the DC power output of the 10 cm×10 cm array will be 20 W.

There are tradeoffs in the choice for the resistors in the devices and arrays described above. For higher values of resistance, the voltage will be higher and the current will be lower for a given zero-point energy fluctuation power. Diodes generally rectify more efficiently for higher voltages. At the same time the resistance-capacitance (RC) time constant is larger for higher resistances. Therefore there is a tradeoff between rectification efficiency and RC loss as the resistance is changed.

The devices and arrays described above have been described with reference to planar configurations. To form compact systems with further areal density, multiple layers of these devices can optionally be stacked on top of each other and separated by insulators or free space. The devices can also be formed in a nonplanar configuration. For example, the devices can be formed on the surfaces of trenches formed in a substrate or on flexible substrates that can be rolled up.

Device Fabrication.

Figure 13A:
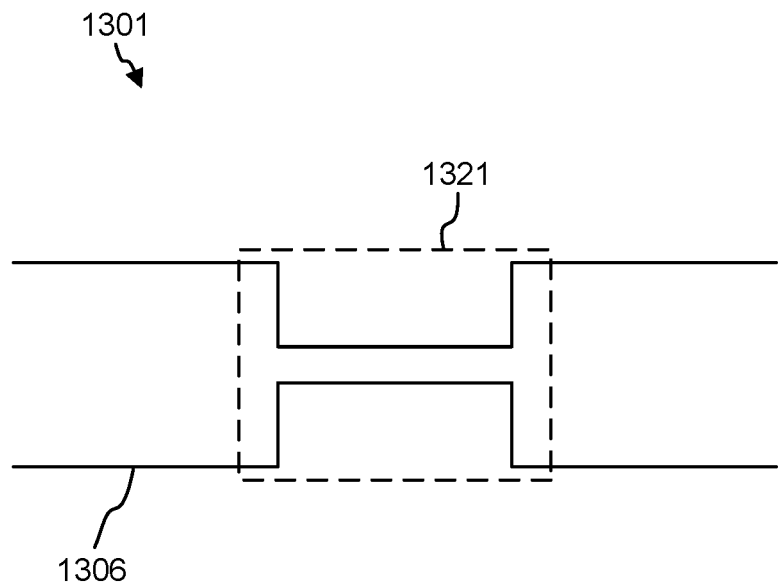
FIG. 13A provides a layout of patterns for fabricating an example Casimir resistor device, in accordance with at least some embodiments.
Figure 13B:
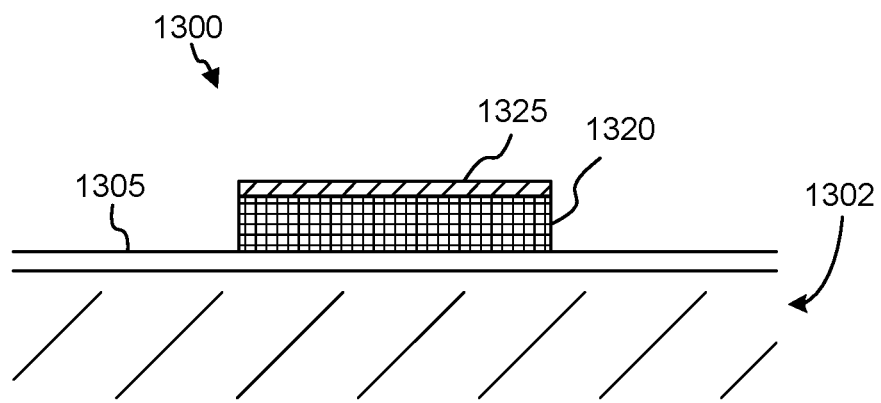
FIG. 13B provides a cross-sectional illustration of an example Casimir resistor device, in accordance with at least some embodiments.

An example fabrication process according to a pattern 1301 shown in FIG. 13A for a Casimir resistor device 1300 as schematically illustrated in cross-section in FIG. 13B is described below.

Casimir resistor device 1300 is shown comprising a planar conductor device, which comprises a metal layer 1305, adjoining a Casimir cavity, which comprises a cavity layer 1320, and a reflective layer 1325. Pattern 1301 includes a metal layer pattern 1306 and Casimir cavity pattern 1321.

In an example, a cell comprising a Casimir resistor device 1300 may have an overall area of 2 µm×3 µm.

Metal Layer.

The metal layer 1305 forms the resistor. By way of example, the following steps can be used for preparation of the metal layer 1305.
1. 20 nm of chromium is evaporated onto the substrate 1302.
2. Positive photoresist is spun onto the substrate and soft baked.
3. Using an aligner, the field of the metal pattern 1306 shown in FIG. 13A is exposed, followed by a post-exposure bake, develop and rinse.
4. The field is etched in a reactive ion etch (ME) system using Freon ($CF_2Cl_2$) gas.
5. The resist is removed in acetone followed by isopropanol and then a water rinse, to form the metal layer 1305 according to metal pattern 1306 shown in FIG. 13A.

Cavity Transparent Layer and Mirror (Casimir Cavity).

The Casimir cavity restricts ZPF modes on one side of the device. By way of example, the following steps can be used for preparation of the cavity layer 1320 and reflective layer 1325.
1. 30 nm of $SiO_2$ is deposited by sputtering onto the substrate, followed by 150 nm of aluminum.
2. Positive photoresist is spun onto the substrate and soft baked.
3. Using an aligner, the field for the Casimir cavity pattern 1321 shown in FIG. 13A is exposed, followed by a post-exposure bake, develop and rinse.
4. The exposed aluminum and $SiO_2$ are etched with 6:1 buffered oxide etch (BOE), followed by a water rinse, to form the cavity layer 1320 and reflective layer 1325 according to Casimir cavity pattern 1321 shown in FIG. 13A.
5. The remaining photoresist is cleaned off with an oxygen plasma.

It will be appreciated that the above description of a fabrication scheme for making Casimir resistor device 1300 is merely exemplary and that a variety of different dimensions, processing schemes, materials, patterns, or the like may be used by the skilled artisan to prepare a Casimir resistor element.

Example Ranges of Dimensions.

Although a cell size of 2 µm×3 µm is described above, other cell sizes can be used. Example cell sizes may be from 0.1 µm on an edge up to 1 mm square. The resistance is determined by the metal, its thickness, and the length and width of the restive region. For example, 20 nm of chromium has a resistance of 1 kΩ/sq. Given a resistor pattern as shown in FIG. 10A or FIG. 13A, for a length that is ten times the width, corresponding to ten squares, the resistance will be 10 kΩ. For a resistor that produces a zero-point energy noise power of 10 µW, as given by Eq. 7, then the zero-point energy noise voltage will be $(10\ \mu W \times 10\ k\Omega)^{0.5}=0.32$ V, which is a suitable voltage for rectification by a diode.

Regarding ease of fabrication, smaller cells may require more expensive or complex fabrication. For example, large area devices having feature sizes of at least 1 mm can be patterned by inexpensive screen printing, whereas submicron features may require expensive deep-UV lithography. There are exceptions, however. For example, nanoimprint lithography can produce some types of submicron features inexpensively, and roll-to-roll manufacturing can produce small features cheaply over large areas. Still, usually larger features can be easier to manufacture.

The conductive layer should be sufficiently thin to provide sufficiently high resistance for the noise voltage to easily rectified by a diode. On the other hand, if it is too thin it may oxidize over time and degrade. Another factor is that it should be sufficiently thick to provide adequate reflectance for the Casimir cavity. For the example of chromium, a useful range is 4 nm to 100 nm, but different conductors will have different useful thickness ranges.

ILLUSTRATIVE ASPECTS

As used below, any reference to a series of aspects (e.g., "Aspects 1-4") or non-enumerated group of aspects (e.g., "any previous or subsequent aspect") is to be understood as a reference to each of those aspects disjunctively (e.g., "Aspects 1-4" is to be understood as "Aspects 1, 2, 3, or 4").

Aspect 1 is a device comprising: an electric device; and a zero-point-energy-density-reducing structure adjoining the electric device, the zero-point-energy-density-reducing structure driving a flow of energy or particles to or from the electric device.

Aspect 2 is the device of any previous or subsequent aspect, wherein the zero-point-energy-density-reducing structure provides a reduction in a zero-point energy density in the electric device as compared to the zero-point energy density in a second electric device not adjoining the zero-point-energy-density-reducing structure and in electrical communication with the electric device.

Aspect 3 is the device of any previous or subsequent aspect, wherein the zero-point-energy-density-reducing structure comprises a Casimir cavity adjoining the electric device.

Aspect 4 is the device of any previous or subsequent aspect, wherein the flow of energy occurs even in the absence of external sources of illumination.

Aspect 5 is the device of any previous or subsequent aspect, further comprising: a second Casimir cavity adjoining the electric device, wherein the electric device is positioned between the Casimir cavity and the second Casimir cavity.

Aspect 6 is the device of any previous or subsequent aspect, comprising a Casimir resistor or a Casimir diode.

Aspect 7 is the device of any previous or subsequent aspect, wherein the electric device comprises a resistor.

Aspect 8 is the device of any previous or subsequent aspect, wherein the resistor comprises a conductive layer adjacent to the Casimir cavity or comprising a component of the Casimir cavity.

Aspect 9 is the device of any previous or subsequent aspect, wherein the conductive layer has a thickness of from 3 nm to 1 mm.

Aspect 10 is the device of any previous or subsequent aspect, wherein the conductive layer comprises a multilayer structure including one or more conductive sub-layers.

Aspect 11 is the device of any previous or subsequent aspect, wherein the conductive layer comprises a metal.

Aspect 12 is the device of any previous or subsequent aspect, wherein the conductive layer comprises a semiconductor.

Aspect 13 is the device of any previous or subsequent aspect, wherein the conductive layer comprises a two-dimensional conductive material.

Aspect 14 is the device of any previous or subsequent aspect, wherein the conductive layer comprises a conductive ceramic.

Aspect 15 is the device of any previous or subsequent aspect, wherein the conductive layer comprises a component of or is in contact with a metal/insulator/metal (MIM) device, a metal/multi-insulator/metal device, a metal/insulator/semiconductor (MIS) device, a semiconductor layer, a two-dimensional semiconductor layer, a Schottky diode, a superconductor/insulator/superconductor (device), or a vacuum diode.

Aspect 16 is the device of any previous or subsequent aspect, wherein the electric device comprises a one-way valve or rectifier.

Aspect 17 is the device of any previous or subsequent aspect, wherein the electric device comprises a diode.

Aspect 18 is the device of any previous or subsequent aspect, wherein the diode is selected from a metal/insulator/metal diode, a geometric diode, a Schottky diode, a metal/insulator/semiconductor (MIS) diode, a Mott diode, a quantum well diode, a ballistic diode, a carbon nanotube diode, or a superconductor/insulator/superconductor device.

Aspect 19 is the device of any previous or subsequent aspect, wherein the diode comprises a geometric diode.

Aspect 20 is the device of any previous or subsequent aspect, wherein the geometric diode has an asymmetric shape providing preferential motion of charge carriers in one direction across the geometric diode as compared to an opposite direction.

Aspect 21 is the device of any previous or subsequent aspect, wherein the geometric diode is a Z-diode.

Aspect 22 is the device of any previous or subsequent aspect, wherein the geometric diode comprises graphene or another two-dimensional conductive material.

Aspect 23 is the device of any previous or subsequent aspect, wherein the geometric diode is disposed adjacent to and in contact with a substrate.

Aspect 24 is the device of any previous or subsequent aspect, wherein the substrate at least partially contacts a component of the Casimir cavity.

Aspect 25 is the device of any previous or subsequent aspect, wherein the diode comprises: a first conductive layer adjacent to the Casimir cavity or comprising a component of the Casimir cavity; an electrically insulating layer disposed adjacent to and in contact with the first conductive layer; and a second conductive layer disposed adjacent to and in contact with the electrically insulating layer.

Aspect 26 is the device of any previous or subsequent aspect, wherein the diode comprises: a conductive layer adjacent to the Casimir cavity or comprising a component of the Casimir cavity; and a semiconductor layer disposed adjacent to and in contact with the conductive layer.

Aspect 27 is the device of any previous or subsequent aspect, wherein the semiconductor layer has a dopant concentration of from $10^{15}$ cm$^{-3}$ to $10^{21}$ cm$^{-3}$ or a subrange thereof, optionally from $10^{15}$ cm$^{-3}$ to $10^{16}$ cm$^{-3}$, $10^{16}$ cm$^{-3}$ to $10^{17}$ cm$^{-3}$, $10^{17}$ cm$^{-3}$ to $10^{18}$ cm$^{-3}$, $10^{18}$ cm$^{-3}$ to $10^{19}$ cm$^{-3}$, $10^{19}$ cm$^{-3}$ to $10^{20}$ cm$^{-3}$, or $10^{20}$ cm$^{-3}$ to $10^{21}$ cm$^{-3}$.

Aspect 28 is a circuit comprising: the device of any previous or subsequent aspect; and a first antenna electrically connected between electrical contacts of the electric device; a second antenna optically coupled to the first antenna; and a free-space electric device, wherein the second antenna is electrically connected between electrical contacts of the free-space electric device.

Aspect 29 is the circuit of any previous or subsequent aspect, further comprising a waveguide optically coupling the first antenna and the second antenna.

Aspect 30 is a circuit comprising: the device of any previous or subsequent aspect; and a free-space electric device electrically connected between a first electrical contact of the electric device and a second electrical contact of the electric device.

Aspect 31 is the circuit of any previous or subsequent aspect, wherein a first zero-point energy density at the electric device is different from a second zero-point energy density at the free-space electric device.

Aspect 32 is the circuit of any previous or subsequent aspect, wherein a first zero-point energy noise power available from the electric device is different from a second zero-point energy noise power available from the free-space electric device.

Aspect 33 is the circuit of any previous or subsequent aspect, wherein the free-space electric device and the electric device are separated from one another by a distance of 1 µm or less.

Aspect 34 is the circuit of any previous or subsequent aspect, wherein the free-space electric device and the electric device are arranged in opposition to one another.

Aspect 35 is the circuit of any previous or subsequent aspect, wherein electrical transmission lines between the free-space electric device and the electric device are capable of carrying signals having a frequency from 1 THz to 3 PHz.

Aspect 36 is the circuit of any previous or subsequent aspect, wherein electrical transmission lines between the free-space electric device and the electric device have a length of less than 1 mm, less than 100 µm, less than 10 µm, less than 1 µm, or less than 100 nm.

Aspect 37 is the circuit of any previous or subsequent aspect, wherein electrical transmission lines between the free-space electric device and the electric device comprise a superconductor.

Aspect 38 is the circuit of any previous or subsequent aspect, further comprising a thermal sink coupled to the electric device.

Aspect 39 is the circuit of any previous or subsequent aspect for providing cooling.

Aspect 40 is the circuit of any previous or subsequent aspect, further comprising a thermal source coupled to the free-space electric device.

Aspect 41 is the circuit of any previous or subsequent aspect for providing heating.

Aspect 42 is the circuit of any previous or subsequent aspect, wherein the free-space electric device is a free-space diode or a free-space resistor.

Aspect 43 is the circuit of any previous or subsequent aspect, wherein the device comprises a Casimir diode or wherein the free-space electric device is a free-space diode; and wherein a difference in zero-point energy noise power from the electric device and from the free-space electric device is rectified to produce a DC power output.

Aspect 44 is the circuit of any previous or subsequent aspect, further comprising a low-pass filter positioned between the first electrical contact and a load connected to the second electrical contact.

Aspect 45 is the circuit of any previous or subsequent aspect, wherein an electrical conductor between the first electrical contact and the load functions as, corresponds to, or comprises the low-pass filter.

Aspect 46 is the circuit of any previous or subsequent aspect, further comprising an insulating layer or spacer, wherein the insulating layer or spacer is positioned between the electric device and the free-space electric device to define a separation between the electric device and the free-space electric device.

Aspect 47 is the circuit of any previous or subsequent aspect, wherein the insulating layer or spacer has a thickness of from 5 nm to 10 µm or wherein a length of one or more transmission lines connecting the free-space electric device to the first electrical contact or the second electrical contact have a length of from 5 nm to 10 µm.

Aspect 48 is a circuit comprising: the device of any previous or subsequent aspect; an insulating layer or spacer, wherein the insulating layer or spacer is positioned adjacent to the electric device; and a free-space electric device, wherein the free-space electric device and the electric device are capacitively coupled.

Aspect 49 is the circuit of any previous or subsequent aspect, wherein the insulating layer has a thickness of from 5 nm to 10 μm.

Aspect 50 is the device of any previous or subsequent aspect, wherein the Casimir cavity comprises: a first reflective layer; a cavity layer; and a second reflective layer, wherein the cavity layer is between the first reflective layer and the second reflective layer.

Aspect 51 is the device of any previous or subsequent aspect, wherein the cavity layer has a thickness of from 10 nm to 2 μm.

Aspect 52 is the device of any previous or subsequent aspect, wherein the cavity layer comprises a condensed-phase optically transparent material layer.

Aspect 53 is the device of any previous or subsequent aspect, wherein the cavity layer comprises a material having a transmittance of greater than 20% for at least some wavelengths of electromagnetic radiation from 100 nm to 10 μm.

Aspect 54 is the device of any previous or subsequent aspect, wherein the first reflective layer comprises a metal, a dielectric reflector, a diffractive reflector, or an interface between the cavity layer and an adjacent material providing a step in index of refraction.

Aspect 55 is the device of any previous or subsequent aspect, wherein a reflectivity of at least of the first reflective layer or the second reflective layer is greater than 50%.

Aspect 56 is the device of any previous or subsequent aspect, wherein the second reflective layer comprises one or more components of the electric device.

Aspect 57 is the device of any previous or subsequent aspect, further comprising a substrate, wherein the zero-point-energy-density-reducing structure is disposed adjacent to and supported by the substrate.

Aspect 58 is the device of any previous or subsequent aspect, further comprising a substrate, wherein the electric device is disposed adjacent to and supported by the substrate.

Aspect 59 is a device array comprising: a plurality of circuits of any previous or subsequent aspect arranged in an array configuration.

Aspect 60 is the device array of any previous or subsequent aspect, wherein at least a subset of the plurality of circuits are arranged in a series configuration with one another.

Aspect 61 is the device array of any previous or subsequent aspect, wherein at least a subset of the plurality of circuits are arranged in a parallel configuration with one another.

Aspect 62 is the device array of any previous or subsequent aspect, wherein the plurality of circuits are arranged in a combination of series and parallel configurations with one another.

Aspect 63 is a device stack comprising: a plurality of device layers arranged in a stacked configuration, wherein each device layer comprises one or more devices or circuits of any previous or subsequent aspect.

Aspect 64 is the device stack of any previous or subsequent aspect, wherein each device layer is positioned above and/or below another device layer.

Aspect 65 is the device stack of any previous or subsequent aspect, wherein each device layer corresponds to an array comprising a plurality of the devices or circuits of any previous or subsequent aspect.

Aspect 66 is the device of any previous or subsequent aspect, further comprising a load positioned to receive electric power from the electric device.

Aspect 67 is the device of any previous or subsequent aspect, incorporated into a system for providing signal communication.

Aspect 68 is the device of any previous or subsequent aspect, for providing detection of zero-point energy fluctuation levels.

Aspect 69 is the device of any previous aspect, for providing reduced electrical noise in the electric device.

REFERENCES

U.S. Pat. Nos. 7,379,286, 8,803,340, and 9,581,142.

Atar et al., 2013, "Plasmonically enhanced hot electron based photovoltaic device," Optics Express 21:6, 7196-7201.

Blandford and Thorne, 2008, "Applications of Classical Physics," Lecture Notes Chapter 6, California Institute of Technology, Version 12.

Brongersma, 2015, "Plasmon-induced hot carrier science and technology," Nature Nanotechnology, 10:1, 25-34.

Chalabi et al., 2014, "Hot-electron photodetection with a plasmonic nanostripe antenna," Nano Lett., 14:3, 1374-1380.

Clavero, 2014, "Plasmon induced hot-electron generation at nanoparticle/metal-oxide interfaces for photovoltaic and photocatalytic devices," Nature Photonics, 8:2, 95-103.

Du et al., 2013, "Ultrafast plasmon induced electron injection mechanism in gold-$TiO_2$ nanoparticle system." J. Photochem. and Photobiol. C: Photochem. Revs., 15, 21-30.

Gall, 2016, "Electron mean free path in elemental metals," J. Appl. Phys., 119:8, 085101.

Genet et al., 2003, "Casimir force and the quantum theory of lossy optical cavities," Phys. Rev. A., 67:4, 043811.

Gong et al., 2007, "Design of plasmonic cavities for solid-state cavity quantum electrodynamics applications," Appl. Phys. Lett., 90:3, 033113.

Helman et al., 1973, "Theory of internal photoemission," Phys. Rev. B, 7:8, 3702.

Herner et al., 2017, "High performance MIIM diode based on cobalt oxide/titanium oxide," Appl. Phys. Lett., 110, 223901.

John et al., 2017, "Optical properties of graphene, silicene, germanene, and stanene from IR to far UV—a first principles study," J. Phys. and Chem. of Solids, 110, 307-315.

Kish, 2005, "Stealth communication: Zero-power classical communication, zero-quantum quantum communication and environmental-noise communication," Appl. Phys. Lett., 87:23, 234109.

Kish et al., 2016, "Zero-point term and quantum effects in the Johnson noise of resistors: a critical appraisal," J. Stat. Mech.: Theory and Experiment, 2016:5, 054006.

Knight et al., 2013, "Embedding plasmonic nanostructure diodes enhances hot electron emission," Nano Lett., 13:4, 1687-1692.

Kodama et al., 2001, "Fast heating of ultrahigh-density plasma as a step towards laser fusion ignition," Nature, 412:6849, 798.

Lambe et al., 1976, "Light emission from inelastic electron tunneling," Phys. Rev. Lett., 37:14, 923.
Lebedev et al., 1999, "The dynamics of wire array Z-pinch implosions," Phys. of Plasmas, 6:5, 2016-2022.
McCarthy et al., 1977, "Enhancement of light emission from metal-insulator-metal tunnel junctions," Appl. Phys. Lett., 30:8, 427-429.
Mizuguchi et al., 2007, "Simulation of high-energy proton production by fast magnetosonic shock waves in pinched plasma discharges," Phys. of Plasmas, 14:3, 032704.
Moddel, G. and Dmitriyeva, O., 2019, "Extraction of Zero-Point Energy from the Vacuum: Assessment of Stochastic Electrodynamics-Based Approach as Compared to Other Methods," Atoms, 7(2), 51.
Sze et al., 2006, "Physics of semiconductor devices," John Wiley & Sons, p. 682.
van Dorp et al., 2009, "SiC: a photocathode for water splitting and hydrogen storage," Angewandte Chemie Intl. Ed., 48:33, 6085-6088
Viswanath et al., 2019, "A nanosheet phosphor of double-layered perovskite with unusual intrananosheet site activator concentration," Chem. Eng. J., 122044.
Wang et al., 2000, "Light emission from the double-barrier $Al/Al_2O_3/Al/Al_2O_3/Au$ tunnel junction," Thin Solid Films, 371:1-2, 191-194.
Wang et al., 2011, "Plasmonic energy collection through hot carrier extraction," Nano Lett., 11:12, 5426-5430.
Wang et al., 2017, "Field-assisted splitting of pure water based on deep-sub-debye-length nanogap electrochemical cells," ACS Nano, 11:8, 8421-8428.
Walter et al., 2010, "Solar water splitting cells," Chem. Rev. 110:11, 6446-6473.
Zhu, 2014, "Graphene Geometric Diodes for Optical Rectennas," PhD Thesis, University of Colorado, 68-77.
Zhu et al., 2019, "Graphene Geometric Diodes for Terahertz Rectennas, J. Phys. D: Appl. Phys., 46, 185101.

STATEMENTS REGARDING INCORPORATION BY REFERENCE AND VARIATIONS

All references throughout this application, for example patent documents including issued or granted patents or equivalents, patent application publications, and non-patent literature documents or other source material, are hereby incorporated by reference herein, as though individually incorporated by reference.

All patents and publications mentioned in the specification are indicative of the levels of skill of those skilled in the art to which the invention pertains. References cited herein are incorporated by reference herein to indicate the state of the art, in some cases as of their filing date, and it is intended that this information can be employed herein, if needed, to exclude (for example, to disclaim) specific embodiments that are in the prior art.

When a group of substituents is disclosed herein, it is understood that all individual members of those groups and all subgroups and classes that can be formed using the substituents are disclosed separately. When a Markush group or other grouping is used herein, all individual members of the group and all combinations and subcombinations possible of the group are intended to be individually included in the disclosure. As used herein, "and/or" means that one, all, or any combination of items in a list separated by "and/or" are included in the list; for example "1, 2 and/or 3" is equivalent to "'1' or '2' or '3' or '1 and 2' or '1 and 3' or '2 and 3' or '1, 2 and 3'".

Every formulation or combination of components described or exemplified can be used to practice the invention, unless otherwise stated. Specific names of materials are intended to be exemplary, as it is known that one of ordinary skill in the art can name the same material differently. It will be appreciated that methods, device elements, starting materials, and synthetic methods other than those specifically exemplified can be employed in the practice of the invention without resorting to undue experimentation. All art-known functional equivalents, of any such methods, device elements, starting materials, and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A device comprising:
    an electric device; and
    a zero-point-energy-density-reducing structure adjoining the electric device, the zero-point-energy-density-reducing structure driving a flow of energy to or from the electric device.

2. The device of claim 1, wherein the zero-point-energy-density-reducing structure provides a reduction in a zero-point energy density in the electric device as compared to the zero-point energy density in a second electric device not adjoining the zero-point-energy-density-reducing structure and in electrical communication with the electric device.

3. The device of claim 1, wherein the zero-point-energy-density-reducing structure comprises a Casimir cavity adjoining the electric device.

4. The device of claim 3, wherein the flow of energy occurs even in an absence of external sources of illumination.

5. The device of claim 3, further comprising:
a second Casimir cavity adjoining the electric device, wherein the electric device is positioned between the Casimir cavity and the second Casimir cavity.

6. The device of claim 3, wherein the electric device comprises a resistor.

7. The device of claim 6, wherein the resistor comprises a conductive layer adjacent to the Casimir cavity or comprising a component of the Casimir cavity.

8. The device of claim 7, wherein the conductive layer comprises a multilayer structure including one or more conductive sub-layers.

9. The device of claim 7, wherein the conductive layer comprises a metal.

10. The device of claim 7, wherein the conductive layer comprises a semiconductor.

11. The device of claim 7, wherein the conductive layer comprises a two-dimensional conductive material.

12. The device of claim 7, wherein the conductive layer comprises a conductive ceramic.

13. The device of claim 3, wherein the electric device comprises rectifier.

14. The device of claim 3, wherein the electric device comprises a diode.

15. The device of claim 14, wherein the diode comprises a geometric diode.

16. The device of claim 15, wherein the geometric diode comprises graphene.

17. The device of claim 14, wherein the diode comprises:
a first conductive layer adjacent to the Casimir cavity or comprising a component of the Casimir cavity;
an electrically insulating layer disposed adjacent to and in contact with the first conductive layer; and
a second conductive layer disposed adjacent to and in contact with the electrically insulating layer.

18. The device of claim 14, wherein the diode comprises:
a conductive layer adjacent to the Casimir cavity or comprising a component of the Casimir cavity; and
a semiconductor layer disposed adjacent to and in contact with the conductive layer.

19. A circuit comprising:
the device of claim 3; and
a first antenna electrically connected between electrical contacts of the electric device;
a second antenna optically coupled to the first antenna; and
a free-space electric device, wherein the second antenna is electrically connected between electrical contacts of the free-space electric device.

20. The circuit of claim 19, further comprising a waveguide optically coupling the first antenna and the second antenna.

21. A circuit comprising:
the device of claim 3; and
a free-space electric device electrically connected between a first electrical contact of the electric device and a second electrical contact of the electric device.

22. The circuit of claim 21, wherein a first zero-point energy density at the electric device is different from a second zero-point energy density at the free-space electric device.

23. The circuit of claim 21, wherein a first zero-point energy noise power available from the electric device is different from a second zero-point energy noise power available from the free-space electric device.

24. The circuit of claim 21, wherein the free-space electric device and the electric device are separated from one another by a distance of 1 μm or less.

25. The circuit of claim 21, wherein the free-space electric device and the electric device are arranged in opposition to one another.

26. The circuit of claim 21, wherein electrical transmission lines between the free-space electric device and the electric device are capable of carrying signals having a frequency from 1 THz to 3 PHz.

27. The circuit of claim 21, wherein electrical transmission lines between the free-space electric device and the electric device comprise a superconductor.

28. The circuit of claim 21, further comprising a thermal sink coupled to the electric device.

29. The circuit of claim 28 for providing cooling.

30. The circuit of claim 21, further comprising a thermal source coupled to the free-space electric device.

31. The circuit of claim 30 for providing heating.

32. The circuit of claim 21, wherein the free-space electric device is a free-space diode or a free-space resistor.

33. The circuit of claim 21, wherein the device comprises a Casimir diode or wherein the free-space electric device is a free-space diode; and
wherein a difference in zero-point energy noise power from the electric device and from the free-space electric device is rectified to produce a DC power output.

34. The circuit of claim 21, further comprising a low-pass filter positioned between the first electrical contact and a load connected to the second electrical contact.

35. The circuit of claim 21, further comprising an insulating layer or spacer, wherein the insulating layer or spacer is positioned between the electric device and the free-space electric device to define a separation between the electric device and the free-space electric device.

36. The circuit of claim 35, wherein the insulating layer or spacer has a thickness of from 5 nm to 10 μm or wherein a length of one or more transmission lines connecting the free-space electric device to the first electrical contact or the second electrical contact have a length of from 5 nm to 10 μm.

37. A circuit comprising:
the device of claim 3;
an insulating layer or spacer, wherein the insulating layer or spacer is positioned adjacent to the electric device; and
a free-space electric device, wherein the free-space electric device and the electric device are capacitively coupled.

38. The circuit of claim 37, wherein the insulating layer has a thickness of from 5 nm to 10 μm.

39. The device of claim 3, wherein the Casimir cavity comprises:
a first reflective layer;
a cavity layer; and
a second reflective layer, wherein the cavity layer is between the first reflective layer and the second reflective layer.

40. The device of claim 39, wherein the cavity layer has a thickness of from 10 nm to 2 μm.

41. The device of claim 39, wherein the cavity layer comprises a condensed-phase optically transparent material layer.

42. The device of claim 39, wherein the cavity layer comprises a material having a transmittance of greater than 20% for at least some wavelengths of electromagnetic radiation from 100 nm to 10 μm.

43. The device of claim 39, wherein the first reflective layer comprises a metal.

44. The device of claim 39, wherein a reflectivity of at least one of the first reflective layer or the second reflective layer is greater than 50%.

45. The device of claim 39, wherein the second reflective layer comprises one or more components of the electric device.

46. A device array comprising:
   a plurality of circuits of claim 21 arranged in an array configuration.

47. The device array of claim 46, wherein the plurality of circuits are arranged in a combination of series and parallel configurations with one another.

48. A device stack comprising:
   a plurality of device layers arranged in a stacked configuration, wherein each device layer comprises one or more devices of claim 1.

49. The device stack of claim 48, wherein each device layer corresponds to an array comprising a plurality of the devices.

50. The device of claim 1, further comprising a load positioned to receive electric power from the electric device.

51. The device of claim 1, incorporated into a system for providing signal communication.

52. The device of claim 1, for providing detection of zero-point energy fluctuation levels.

53. The device of claim 1, for providing reduced electrical noise in the electric device.

* * * * *